(12) United States Patent
Imai et al.

(10) Patent No.: US 6,509,273 B1
(45) Date of Patent: Jan. 21, 2003

(54) METHOD FOR MANUFACTURING A SEMICONDUCTOR DEVICE

(75) Inventors: Toshinori Imai, Ome (JP); Naofumi Ohashi, Hanno (JP); Yoshio Homma, Hinode (JP); Seiichi Kondo, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/527,751

(22) Filed: Mar. 17, 2000

(30) Foreign Application Priority Data

Apr. 28, 1999 (JP) .............................. 11-123061

(51) Int. Cl.$^7$ ..................... H01L 21/302; H01L 21/462
(52) U.S. Cl. ........................................ 438/693; 438/691
(58) Field of Search ................................. 438/689, 691, 438/693, 690, 704, 706, 724, 734, 757; 451/57, 41–48, 287–290

(56) References Cited

U.S. PATENT DOCUMENTS

| | | | | |
|---|---|---|---|---|
| 5,913,712 A | * | 6/1999 | Molinar | 451/41 |
| 6,117,775 A | * | 9/2000 | Kondo et al. | 438/690 |
| 6,153,043 A | | 11/2000 | Edelstein et al. | |
| 6,251,787 B1 | | 6/2001 | Edelstein et al. | |
| 6,261,157 B1 | * | 7/2001 | Bajij et al. | 451/57 |

FOREIGN PATENT DOCUMENTS

| | | |
|---|---|---|
| JP | 2-278822 | 11/1990 |
| JP | 7-94455 | 4/1995 |
| JP | 7-233485 | 9/1995 |
| JP | 8-64594 | 3/1996 |
| JP | 8-83780 | 3/1996 |
| JP | 10-214834 | 8/1998 |

* cited by examiner

*Primary Examiner*—Caridad Everhart
*Assistant Examiner*—Calvin Lee
(74) *Attorney, Agent, or Firm*—Antonelli, Terry, Stout & Kraus, LLP

(57) ABSTRACT

Problematic dishing and erosion in forming embedded metal interconnection by a chemical mechanical polishing (CMP) method are suppressed.

Formation of embedded Cu interconnects 46a to 46e by chemical mechanical polishing of a Cu film 46 formed in interconnect trenches 40 to 44 is performed by abrasive-grain-free chemical mechanical polishing using a polishing liquid of an abrasive grain content less than 0.5 wt % (CMP of the first step); with-abrasive-grain chemical mechanical polishing using a polishing liquid of an abrasive grain content of 0.5 or more wt % (CMP of the second step); and selective chemical mechanical polishing using a polishing liquid to which an anticorrosive such as benzotriazole (BTA) is added (CMP of the third step).

45 Claims, 25 Drawing Sheets

FIG. 15

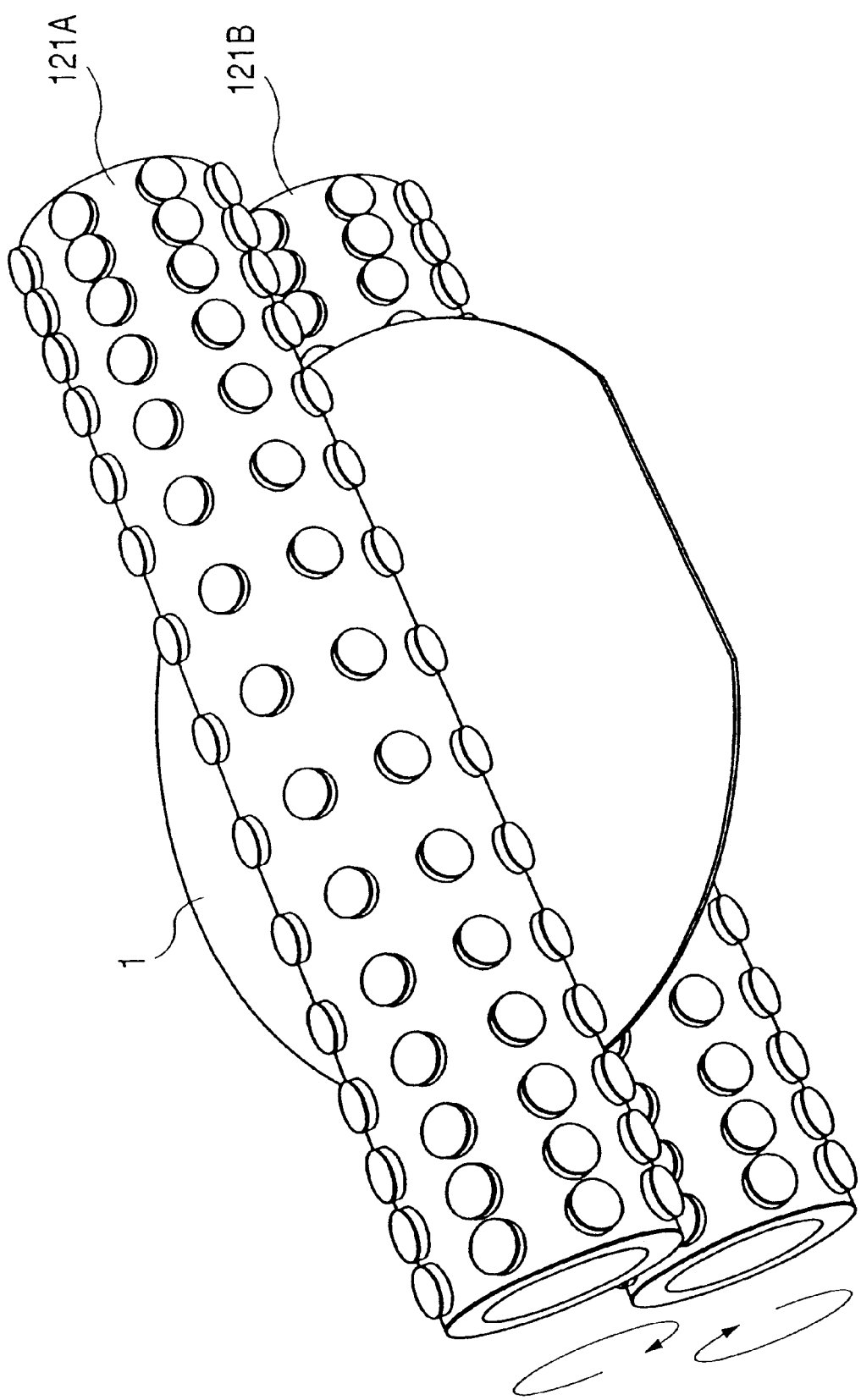

METHOD FOR MANUFACTURING A SEMICONDUCTOR DEVICE

BACKGROUND OF THE INVENTION

1. Field of the Invention

The present invention relates to a fabrication process for a semiconductor integrated circuit device and particularly, to a useful technique that is applied in formation of embedded metal interconnection using a chemical mechanical polishing (CMP) method.

2. Description of the Prior Art

In recent years, a chemical mechanical polishing (CMP) method has been introduced as one of new micro-fabrication techniques in company with development toward higher integration and higher performance of LSI. This technique is disclosed in, for example, U.S. Pat. No. 4,944,836.

Increase in Al interconnect resistance is conspicuous as scaling down of Al interconnection advances and especially in a high performance logic LSI, the increase in interconnect resistance has been a great obstacle in the way of further improvement of the performance. In light of such a situation, embedded Cu interconnection by means of the so-called Damascene process has been under development: Interconnect trenches (and through-holes) are formed in an insulating film deposited on a silicon substrate, then a Cu film whose resistivity is lower than an Al film is deposited on the insulating film and in interiors of the trenches (and the through-holes), thereafter unnecessary part of the Cu film outside the trenches is polished off by chemical mechanical polishing. This technique is disclosed, for example, in the publications of Unexamined Japanese Patent Applications Nos. Hei 2-278822 and Hei 10-214834.

The chemical mechanical polishing (CMP) uses a polishing liquid (a slurry) mainly composed of abrasive grains made of particles of alumina, silica or the like and an oxidizing agent, and a metal surface is removed by a mechanical force of the abrasive grains as oxides produced by an oxidizing action of the oxidizing agent on the surface. As for a polishing liquid (a slurry), the following improvements of technique have been disclosed for example:

A technique is described in the publication of Unexamined Japanese Patent Application No. Hei 7-94455: Aqueous solutions are employed as dispersion media for abrasive grains; as solutes, there can be named: hydrochloric acid, ammonium persulfate, chromium oxide, phosphoric acid, ammonium hydroxide, a mixture of copper ammonium chloride and ammonium hydroxide, a mixture of ammonium hydroxide and hydrogen peroxide and furthermore, mixtures of the aqueous solutions can be used. With such an abrasive grain liquid in use, a polishing speed ratio (R) of a metal film including copper to an insulating film (silicon oxide film) is adjusted so as to be larger than 1 and thereby, controllability of an interconnect film thickness is increased. This publication further describes a technique in which an abrasive grain liquid containing silica particles of an average particle diameter of 0.1 $\mu m$ or less is used in order to prevent a surface of a metal film including Cu which is comparatively soft from being damaged by alumina abrasive grains.

A technique is described in the publication of Unexamined Japanese Patent Application No. Hei 7-233485: A Cu based metal polishing liquid which contains at least one organic acid selected from aminoacetate and amidosulfuric acid, an oxidizing agent (hydrogen peroxide) and water is used and the polishing liquid exerts almost no etching on Cu or Cu alloy when just being immersed in the polishing liquid, whereas the polishing liquid dissolves Cu or Cu alloy when being polished and an etching speed shows tens of times faster in the polishing than when just being immersed.

A technique is described in the publication of Unexamined Japanese Patent Application No. Hei 8-64594: Corrosion of a metal film surface during polishing or after polishing is suppressed and thereby deterioration in quality of interconnection is prevented from occurring. An abrasive grain liquid is employed in which a chemical component forming an anticorrosive coat on a surface of a Cu containing film when polishing the film is mixed, the chemical component being, for example, benzotriazole, and a 2-aminotiazole derivative salt and a copper salt of an inorganic acid.

A technique is described in the publication of Unexamined Japanese Patent Application No. Hei 8-83780: A polishing agent contains a chemical reagent forming a protective film on a metal film surface and an etching agent of a metal film. The polishing agent is used in chemical mechanical polishing of a film of Cu or a Cu containing metal. The chemical reagent may be, for example, benzotriazole or its derivative and the etching agent may contain, for example, aminoacetate and/or amidosulfuric acid; and an oxidizing agent such as hydrogen peroxide, nitric acid or hypochlorous acid.

In a formation process for embedded metal interconnection by chemical mechanical polishing, part of a metal film is left on an insulating film when a unnecessary portion of the metal film on an insulating film outside interconnection trenches formed in the insulating film is removed by the chemical mechanical polishing: the metal film in a recess on a surface of the insulating film caused by a step profile on a surface of an underlying mass cannot be removed. This metal film residue is a cause for a short between embedded interconnects and therefore, the residue is required to be perfectly removed by over-polishing.

If the over-polishing is conducted, however, a phenomenon occurs that embedded interconnects in interconnect trenches are polished so that the center surface portion of each interconnect is excessively removed compared with a peripheral portion thereof and thereby, the center surface portion is selectively withdrawn inwardly compared with the peripheral portion (called dishing) and at the same time, another phenomenon occurs that a surface portion of an insulating film around the opening of each interconnect trench is selectively polished off and also withdrawn inwardly (erosion). When such phenomena occur, interconnect resistance increases because of reduction in sectional area of embedded interconnects. Besides, a problem as in the case described above arises since the above described dishing and erosion are reflected on surface topography of an insulating film deposited on the embedded interconnects with dishing and erosion and recesses occur on the surface of an insulating film thus deposited.

In particular, when embedded interconnects are formed using Cu or Cu alloy, there is a necessity that a conductive barrier layer such as a TiN (titanium nitride) layer that suppresses diffusion of Cu and shows high adhesiveness to an insulating film is interposed between the insulating film and a Cu (alloy) film since Cu has a nature that Cu is easy to diffuse in an insulating film and poor in adhesiveness to an insulating film. Hence, in the formation process of embedded interconnection using Cu (alloy), it is necessary to over-polish a Cu (alloy) film and over-polish a conductive barrier film, so that dishing and erosion are apt to arise in correspondence to levels of the over-polishing and the over-etching.

SUMMARY OF THE INVENTION

It is an object of the present invention to provide a technique that can suppress dishing and erosion which is problematic in formation of embedded metal interconnection by means of a chemical mechanical polishing method.

The above described object and other objects, and new features of the present invention will be apparent from the following description and the accompanying drawings.

Simple description will below be made of outlines of typical aspects of the present invention which are disclosed in the present application:

1. A method for fabricating a semiconductor integrated circuit device, comprising the steps of:
    (a) forming an insulating film on a body, the insulating film having an opening;
    (b) forming a conductive barrier layer in the opening and overlying the insulating film;
    (c) forming a metal film on the conductive barrier layer inside the opening and overlying the insulating film, to fill the opening;
    (d) removing the metal film outside the opening by means of abrasive-grain-free chemical mechanical polishing;
    (e) after the step (d), removing any metal film locally remaining on the conductive barrier layer on the insulating film by means of with-abrasive-grain chemical mechanical polishing; and
    (f) after the step (e), removing the conductive barrier layer remaining on the insulating film by means of selective chemical mechanical polishing that selectively polishes the conductive barrier layer relatively to the metal film.

2. A method for fabricating a semiconductor integrated circuit device according to 1, wherein the insulating film has a plurality of layers.

3. A method for fabricating a semiconductor integrated circuit device according to 1, wherein the metal film is made of Cu or alloy containing Cu as a main component.

4. A method for fabricating a semiconductor integrated circuit device according to 1, wherein the abrasive-grain-free chemical mechanical polishing is conducted using a polishing liquid having an abrasive grain concentration less than 0.1 wt % of the combined weight of liquid and the abrasive grains.

5. A method for fabricating a semiconductor integrated circuit device according to 1, wherein the opening is a hole.

6. A method for fabricating a semiconductor integrated circuit device according to 1, wherein the opening is a trench.

7. A method for fabricating a semiconductor integrated circuit device according to 1, wherein in the selective chemical mechanical polishing, a polishing selectivity ratio of the conductive barrier layer to the metal film is at least 10:1.

8. A method for fabricating a semiconductor integrated circuit device, comprising the steps of:
    (a) forming an insulating film on a body, the insulating film having an opening;
    (b) forming a conductive barrier layer in the opening and overlying the insulating film;
    (c) forming a metal film on the conductive barrier layer inside the opening and overlying the insulating film, to fill the opening;
    (d) removing the metal film outside the opening by means of first chemical mechanical polishing in which a selectivity of the metal film to the conductive barrier layer is at least 5:1;
    (e) after the step (d), removing any metal film locally remaining on the conductive barrier layer on the insulating film by means of second chemical mechanical polishing in which a selectivity of the metal film to the conductive barrier layer is lower than that in the first chemical mechanical polishing; and
    (f) after the step (e), removing the conductive barrier layer remaining on the insulating film by means of third chemical mechanical polishing in which a selectivity of the conductive barrier layer to the metal film is at least 5:1.

9. A method for fabricating a semiconductor integrated circuit device according to 8, wherein the insulating film has a plurality of layers.

10. A method for fabricating a semiconductor integrated circuit device according to 8, wherein the metal film is made of Cu or alloy containing Cu as a main component.

11. A method for fabricating a semiconductor integrated circuit device according to 8, wherein a polishing selectivity ratio of the metal film to the conductive barrier layer in the first chemical mechanical polishing is at least 8:1.

12. A method for fabricating a semiconductor integrated circuit device according to 8, wherein a polishing selectivity ratio of the metal film to the conductive barrier layer in the second chemical mechanical polishing is at most 3:1.

13. A method for fabricating a semiconductor integrated circuit device according to 8, wherein a polishing selectivity ratio of the conductive barrier layer to the metal film in the third chemical mechanical polishing is at least 10:1.

14. A method for fabricating a semiconductor integrated circuit device according to 8, wherein a polishing selectivity ratio of the conductive barrier layer to the metal film in the third chemical mechanical polishing is at least 20:1.

15. A method for fabricating a semiconductor integrated circuit device according to 8, wherein the conductive barrier layer is made of TiN.

16. A method for fabricating a semiconductor integrated circuit device according to 8, wherein the first chemical mechanical polishing and the second chemical mechanical polishing are respectively conducted using different polishing pads.

17. A method for fabricating a semiconductor integrated circuit device, comprising the steps of:
    (a) forming an insulating film on a body, the insulating film having an opening;
    (b) forming a conductive barrier layer in the opening and overlying the insulating film;
    (c) forming a metal film on the conductive barrier layer inside the opening and overlying the insulating film, to fill the opening;
    (d) removing the metal film outside the opening by means of abrasive-grain-free chemical mechanical polishing;
    (e) after the step (d), removing any metal film locally remaining on the conductive barrier layer on the insulating film by means of with-abrasive-grain chemical mechanical polishing; and
    (f) after the step (e), removing the conductive barrier layer remaining on the insulating film by means of a selective removal process that selectively removes the conductive barrier layer relatively to the metal film.

18. A method for fabricating a semiconductor integrated circuit device according to 17, wherein the selective removal process of the step (f) is dry etching.

19. A method for fabricating a semiconductor integrated circuit device, comprising the steps of:
    (a) forming an insulating film on a body, the insulating film having an opening;

(b) forming a conductive barrier layer in the opening and overlying the insulating film;

(c) forming a metal film on the conductive barrier layer inside the opening and overlying the insulating film, to fill the opening;

(d) removing the metal film outside the opening by means of first chemical mechanical polishing using a first polishing liquid in a state belonging to a corrosive region of the metal film;

(e) after the step (d), removing any metal film locally remaining on the conductive barrier layer on the insulating film by means of second chemical mechanical polishing in which a selectivity of the metal film to the conductive barrier layer is lower than that in the first chemical mechanical polishing; and (f) after the step (e), removing the conductive barrier layer remaining on the insulating film by means of third chemical mechanical polishing in which a selectivity of the conductive barrier layer to the metal film is at least 5:1.

20. A method for fabricating a semiconductor integrated circuit device, comprising the steps of:

(a) forming an insulating film on a body, the insulating film having an opening;

(b) forming a conductive barrier layer in the opening and overlying the insulating film;

(c) forming a metal film on the conductive barrier layer inside the opening and overlying the insulating film, to fill the opening;

(d) removing the metal film outside the opening by means of first chemical mechanical polishing in which a selectivity of the metal film to the conductive barrier layer is at least 5:1;

(e) after the step (d), removing any metal film locally remaining on the conductive barrier layer on the insulating film by means of second chemical mechanical polishing in which a selectivity of the metal film to the conductive barrier layer is lower than that in the first chemical mechanical polishing; and (f) after the step (e), removing the conductive barrier layer remaining on the insulating film by means of third chemical mechanical polishing in which a selectivity of the conductive barrier layer to the metal film is higher than that in the second chemical mechanical polishing.

21. A method for fabricating a semiconductor integrated circuit device according 20, wherein the third chemical mechanical polishing is conducted using a third polishing liquid containing an anticorrosive.

22. A method for fabricating a semiconductor integrated circuit device according to 21, wherein the anticorrosive includes benzotriazole.

23. A method for fabricating a semiconductor integrated circuit device according to 22, wherein a concentration of benzotriazole included in the third polishing liquid is in the range of 0.001 to 1 wt %.

24. A method for fabricating a semiconductor integrated circuit device according to 22, wherein a concentration of benzotriazole included in the third polishing liquid is in the range of 0.01 to 1 wt %.

25. A method for fabricating a semiconductor integrated circuit device according to 20, wherein the insulating film has a plurality of layers.

26. A method for fabricating a semiconductor integrated circuit device according to 20, wherein the first chemical mechanical polishing and the second chemical mechanical polishing are respectively conducted using different polishing pads.

27. A method for fabricating a semiconductor integrated circuit device according to 20, wherein the second chemical mechanical polishing and the third chemical mechanical polishing are respectively conducted using the same polishing pads.

28. A method for fabricating a semiconductor integrated circuit device, comprising the steps of:

(a) forming an insulating film on a body, the insulating film having an opening;

(b) forming a conductive barrier layer in the opening and overlying the insulating film;

(c) forming a metal film on the conductive barrier layer inside the opening and overlying the insulating film, to fill the opening;

(d) removing the metal film outside the opening by means of abrasive-grain-free chemical mechanical polishing using a hard polishing pad;

(e) after the step (d), removing any metal film locally remaining on the conductive barrier layer on the insulating film and the conductive barrier layer on the insulating film by means of chemical mechanical polishing;

(f) after the step (e), removing the conductive barrier layer remaining on the insulating film by means of selective chemical mechanical polishing that selectively polishes the conductive barrier layer relatively to the metal film.

29. A method for fabricating a semiconductor integrated circuit device according to 28, wherein the metal film is made of Cu or alloy containing Cu as a main component.

30. A method for fabricating a semiconductor integrated circuit device according to 28, wherein the conductive barrier layer is made of a material harder than the metal film.

31. A method for fabricating a semiconductor integrated circuit device according to 28, wherein polishing in the step (e) is conducted using a polishing pad softer than that used in polishing in the step (d).

32. A method for fabricating a semiconductor integrated circuit device according to 28, wherein polishing in the step (d) is conducted using a polishing liquid that has a polishing selectivity ratio of the metal film to the conductive barrier layer of at least 5:1; and polishing in the step (e) is conducted using a polishing liquid that has a polishing selectivity ratio of the conductive barrier layer to the metal film is at least 5:1.

33. A method for fabricating a semiconductor integrated circuit device, comprising the steps of:

(a) forming an insulating film on a body, the insulating film having an opening;

(b) forming a conductive barrier layer in the opening and overlying the insulating film;

(c) forming a metal film on the conductive barrier layer inside the opening and overlying the insulating film, to fill the opening;

(d) removing the metal film outside the opening by means of abrasive-grain-free chemical mechanical polishing;

(e) after the step (d), removing any metal film locally remaining on the conductive barrier layer on the insulating film by means of with-abrasive-grain chemical mechanical polishing;

(f) after the step (e), removing the conductive barrier layer remaining on the insulating film by means of selective chemical mechanical polishing that selectively polishes the conductive barrier layer relatively to the metal film; and (g) after the step (f), cleaning the body in a state of light shielding.

34. A method for fabricating a semiconductor integrated circuit device according to 33, wherein the metal film is made of Cu or alloy containing Cu as a main component.

35. A method for fabricating a semiconductor integrated circuit device according to 33, wherein cleaning in the step (g) is conducted in a state of light shielding with an illumination of at most 180 lux.

BRIEF DESCRIPTION OF THE DRAWINGS

FIG. 15 is a sectional view of an essential part of a semiconductor substrate showing a fabrication process for a semiconductor integrated circuit device that is an embodiment of the present invention.

FIG. 19 is a perspective view showing a scrub cleaning method for a wafer.

DETAILED DESCRIPTION OF THE PREFERRED EMBODIMENT

Figure 1:
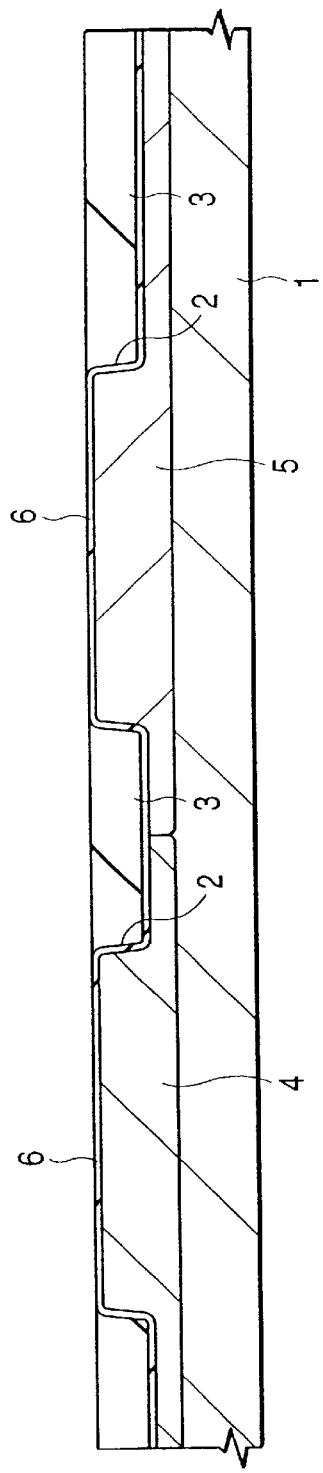
FIG. 1 is a sectional view of an essential part of a semiconductor substrate showing a fabrication process for a semiconductor integrated circuit device that is an embodiment of the present invention.

First of all, description will be made of general meanings of technical terms used in the present application:

A polishing liquid (slurry) generally means a suspension prepared by mixing polishing abrasive grains into a chemical etching agent and the term a polishing liquid (slurry) used in the present application includes a suspension with no polishing abrasive grains therein in consideration of the nature of the present invention.

Abrasive grains or slurry particles are alumina powder or silica powder which is generally contained in a slurry.

Chemical mechanical polishing (CMP) is a way of polishing in which a polished surface is put in contact with a polishing pad made of a cloth-like sheet material that is relatively soft, and the polished surface and the polishing pad are relatively moved in a plane including the interface while supplying a slurry to the interface. In the present application, the chemical mechanical polishing includes chemical mechanical lapping (CML) in which a polished surface is relatively moved on a surface of a hard grinding stone.

Abrasive-grain-free chemical mechanical polishing is chemical mechanical polishing using a slurry of an abrasive grain concentration less than 0.5 wt % and with-abrasive-grain chemical mechanical polishing is chemical mechanical polishing using a slurry of an abrasive grain concentration of 0.5 wt % or more. Despite of such definitions, naming is of a relative nature; in a polishing process which comprises first step polishing and second step polishing following the first step polishing, chemical mechanical polishing in the first step polishing using a slurry of an abrasive grain concentration lower than that in the second step polishing by more than one order of magnitude or desirably more than two orders of magnitude is sometimes called abrasive-grain-free chemical mechanical polishing. This abrasive-grain-free chemical mechanical polishing is described in the U.S. application Ser. No. 09/182,438, the contents of which are incorporated herein by reference in their entirety.

An anticorrosive is a chemical that prevents or suppresses progress in polishing by CMP while forming a corrosion resistant and/or hydrophobic protective film on a metal surface and as anticorrosives, benzotriazole (BTA) and others are generally adopted. This anticorrosive is described in Japanese Laid Open Number 8-64594, the contents of which are incorporated herein by reference in their entirety.

A conductive barrier layer is a barrier layer that is used for generally preventing atoms and ions constituting embedded interconnects from being transported (including diffusion) into the lower layer to adversely affect elements and others in the layer, and the barrier layer is made of a conductive material with a diffusion blocking property including a metal such as Ti, a metal nitride such as TiN; a conductive oxide; conductive nitride; and others, whose electric conductivity is relatively higher than an insulating film. And an opening means a hole or/and a trench.

Selective removal, selective polishing, selective etching and selective chemical mechanical polishing used herein all are of a selectivity ratio of 5 or higher.

An embedded interconnect is an interconnect that is formed by an interconnect formation technique in which after a conductive film is embedded in interiors in trenches or the like formed in an insulating film, unnecessary portion of a conductive film on the insulating film is removed as in a single Damascene process or a dual Damascene process.

In a case where a selectivity ratio of A to B (or B to A) is X, if the case of a polishing rate is taken up as an example, X is a calculated value of a polishing rate for A based on a polishing rate for B as a reference.

In the following embodiments, any of descriptions of the same as or similar portions are not repeated in principle.

Furthermore, when a necessity arises, for convenience, in the following embodiments, description is spread over a plurality of sections or a plurality of embodiments, but the distributed portions of description are related with each other or one another: one is a modification, detailed description or supplemental explanation of part or the whole of the other or another.

Besides, when numerals expressing magnitudes of elements (including the number of things, numerical values, a quantity, a range and the others) are referred to in the following embodiments, there is no specific limitation to particulars of the numerals but more or less than each of the indicated numerals may be adopted instead with exception of when explicitly specified or naturally, though implicitly, limited to the indicated numeral from the viewpoint of the principle. Additionally, in the following embodiments, needless to say, the constituents (including element steps) are not necessarily indispensable with the exception of when explicitly indicated and considered to be apparently indispensable from the viewpoint of the principle.

Similar to this, when constitutional elements such a shape and a positional relation are referred to in the following embodiments, it should be understood that shapes that are virtually approximate or analogous to the originally indicated shape are included therein with the exception of when explicitly specified or considered not to be included from the viewpoint of the principle. This description applies to the above described numerical values and ranges of elements in a similar way.

A semiconductor integrated circuit referred to in the present application should be understood to include a circuit fabricated on a substrate of each of other kinds such as a SOI (Silicon On Insulator) substrate and a TFT (Thin Film Transistor) liquid crystal fabrication substrate with no limitation especially to that fabricated on a single crystal silicon. A wafer, in the description in the present application, is referred to a substrate such as a single crystal silicon substrate (generally of a circular shape), a SOS substrate, a glass substrate, other insulating, semi-insulating and semi-conductive substrates, and composite substrates constituted of the substrates, all of which are used in fabrication of semiconductor integrated circuit device.

Below, description will be made of details of embodiments of the present invention based on the accompanying drawings. In all the drawings for explanation of the embodiments, the same marks are attached to the same constituents and no repetition of description is given of a constituent in the second appearance and thereafter.

A fabrication process for a CMOS-LSI that is an embodiment of the present invention will be described using FIGS. 1 to 20 according to the order of process steps in the fabrication.

At first, as shown in FIG. 1, element isolation trenches 2 are formed in a semiconductor substrate (hereinafter referred to as substrate or wafer) 1 made of p-type single crystal silicon of a resistivity, for example, of the order of a value in the range of 1 to 10 $\Omega$cm. In order to form the element isolation trenches 2, after trenches each 350 nm deep are formed on the substrate 1 by etching off parts of the substrate 1 in element isolation regions, an oxide silicon film 3 is deposited on the substrate 1 and in the interiors of the trenches by a CVD method and subsequently, the oxide silicon film 3 on the trenches are chemically mechanically polished off to globally flatten the surface of the substrate.

Then, a p-type impurity (boron) and an n-type impurity (for example, phosphorus) are ion-implanted in the substrate 1 to form a p type well 4 and an n type well 5 and thereafter, the substrate 1 is steam oxidized to form gate oxide films 6 of a thickness of the order of 6 nm on the surfaces of the p-type well 4 and the n-type well 5.

Figure 2:
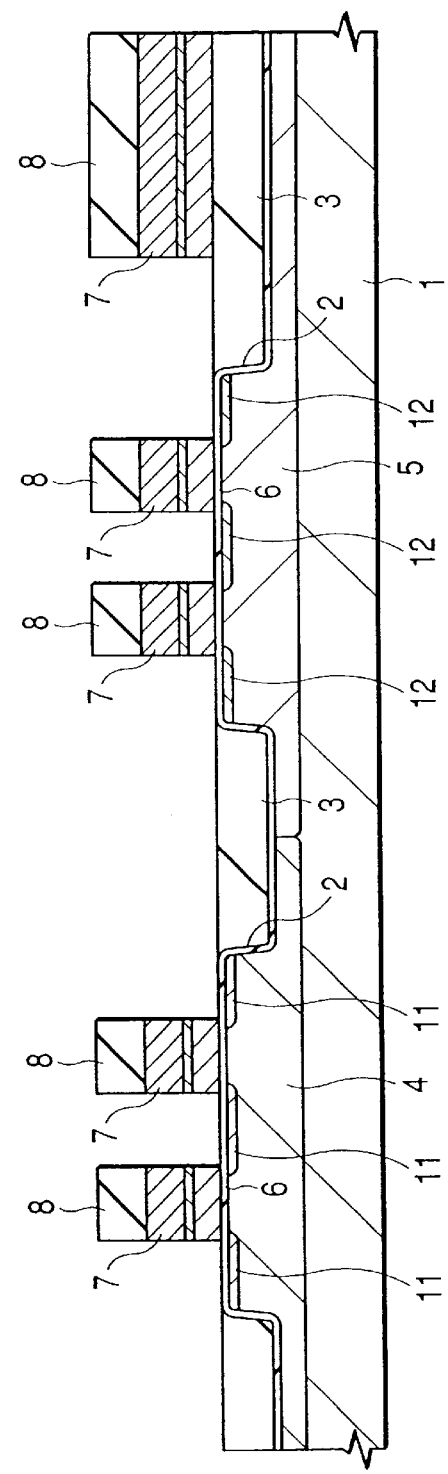
FIG. 2 is a sectional view of an essential part of a semiconductor substrate showing a fabrication process for a semiconductor integrated circuit device that is an embodiment of the present invention.

Then, as shown in FIG. 2, gate electrodes 7 are formed above the gate oxide films 6. In order to form the gate electrodes 7, for example, a low resistivity polysilicon film of a thickness of the order of 50 nm, doped with phosphorus (P), is deposited on the gate oxide films 6 by a CVD method, subsequently a WN (tungsten nitride) film of a thickness of the order of 5 nm and a W (tungsten) film of a thickness of the order of 100 nm are further deposited by a sputtering method thereon and then, a silicon nitride film 8 of a thickness of the order of 100 nm by a CVD method is still further deposited by a CVD method thereon. Thus formed films are patterned by dry etching with a photo-resist film (not shown) as a mask. The gate electrodes 7 may be formed using a stacked layer structure composed of a low resistivity polysilicon film and a W silicide film.

Then, a low impurity concentration $n^-$-type semiconductor region 11 is formed by ion-implantation of an n-type impurity (phosphorus or arsenic) in a p-type well 4 and a low impurity concentration $p^-$-type semiconductor region 12 is formed by ion-implantation of a p-type impurity (boron) in a n-type well 5.

Figure 3:
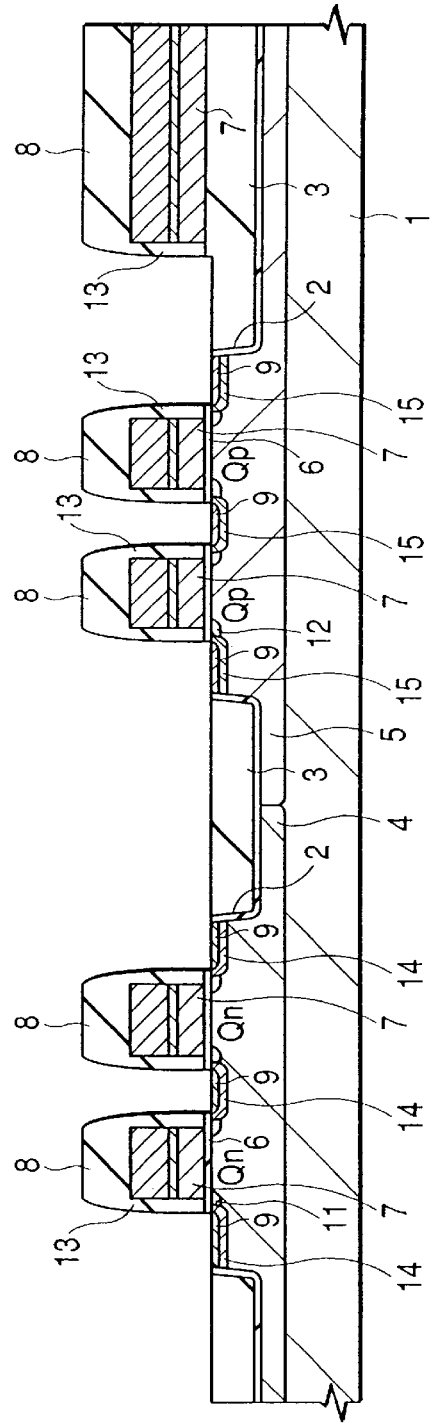
FIG. 3 is a sectional view of an essential part of a semiconductor substrate showing a fabrication process for a semiconductor integrated circuit device that is an embodiment of the present invention.

Then, as shown in FIG. 3, a silicon nitride film deposited by the CVD method on the substrate 1 is anisotropically etched to form sidewall spacers 13 on sidewalls of the gate electrodes 7. Thereafter, an n-type impurity (phosphorus or arsenic) is ion-implanted in a p-type well 4 to form a high impurity concentration $n^+$-type semiconductor regions 14 (a source and a drain) and a p-type impurity (boron) is ion-implanted in an n-well 5 to form a high concentration $p^+$-type semiconductor region 15 (a source and a drain).

Then, the surface of the substrate 1 is cleaned and thereafter, silicide layers 9 are formed on the surfaces of the $n^-$-type semiconductor regions 14 (a source and a drain) and the $p^-$-type semiconductor region 15 (a source and a drain). In order to form the silicide layer 9, a Ti (titanium) film or a Co (cobalt) film of a thickness of the order of 40 nm is deposited on the substrate 1 by the sputtering method, subsequently a heat treatment at about 750° C. in a nitrogen gas atmosphere is applied to the film so as to have the substrate 1 and the Ti film (or Co film) to react with each other, and thereafter, part of the Ti film (or Co film) that has not been reacted with the substrate 1 is removed by wet etching. Through the steps thus far, an n-channel MISFET Qn and a p-channel MISFET Qp are completed.

Figure 4:
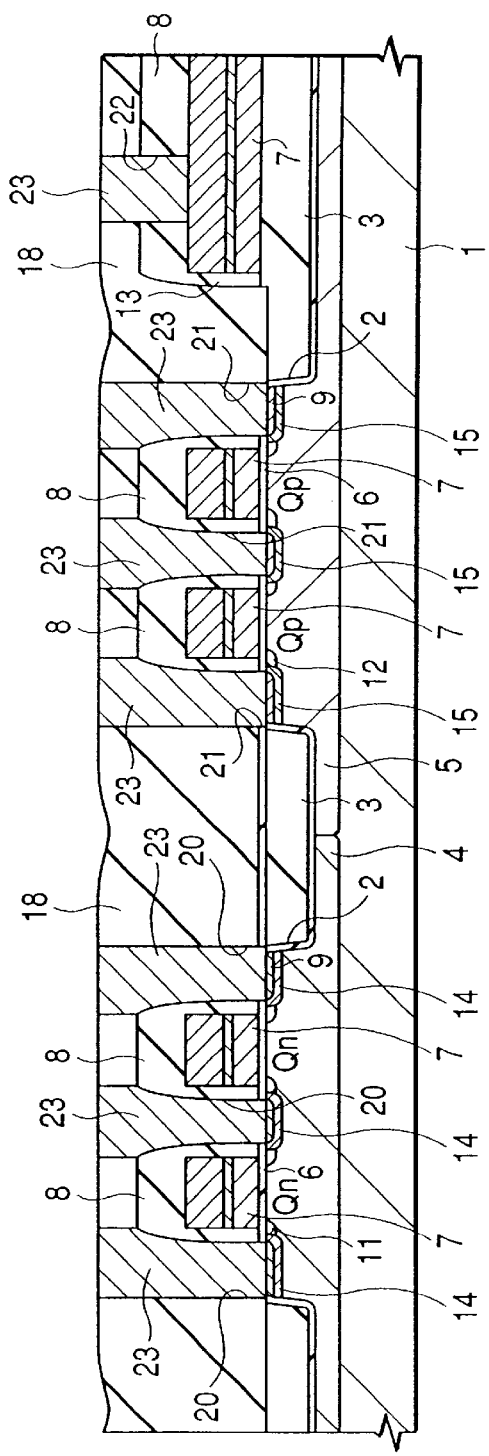
FIG. 4 is a sectional view of an essential part of a semiconductor substrate showing a fabrication process for a semiconductor integrated circuit device that is an embodiment of the present invention.

Then, as shown in FIG. 4, a silicon oxide film 18 of a thickness of the order of 800 nm by a CVD method on the substrate 1 and subsequently, the silicon oxide film 18 is dry etched with a photoresist film as a mask to form contact holes 20 above the $n^+$-type semiconductor regions 14 (a source and a drain) and contact holes 21 above $p^+$-type semiconductor region 15 (a source and a drain). At this time, contact holes 22 are formed above the gate electrodes 7 as well.

The silicon oxide film 18 is made of a film with high reflowing, for example a BPSG (Boron-doped Phospho Silicate Glass) film, with which narrow spaces between the gate electrodes 7 can be filled. Alternatively, a SOG (Spin on Glass) film formed by a spin coat method may be used to obtain the silicon oxide film 18 instead.

Then, plugs 23 are formed in the interiors of the contact holes 20, 21 and 22. In order to form the plugs 23, for example, a TiN film and a W film are deposited on the silicon oxide film 18 and in the interiors of the contact holes 20, 21 and 22 by a CVD method and thereafter, unnecessary parts of the TiN film and the W film on the silicon oxide film 18 are removed by a chemical mechanical method (CMP) or an etch-back method while leaving the films only in the interiors of the contact holes 20, 21 and 22.

Figure 5:
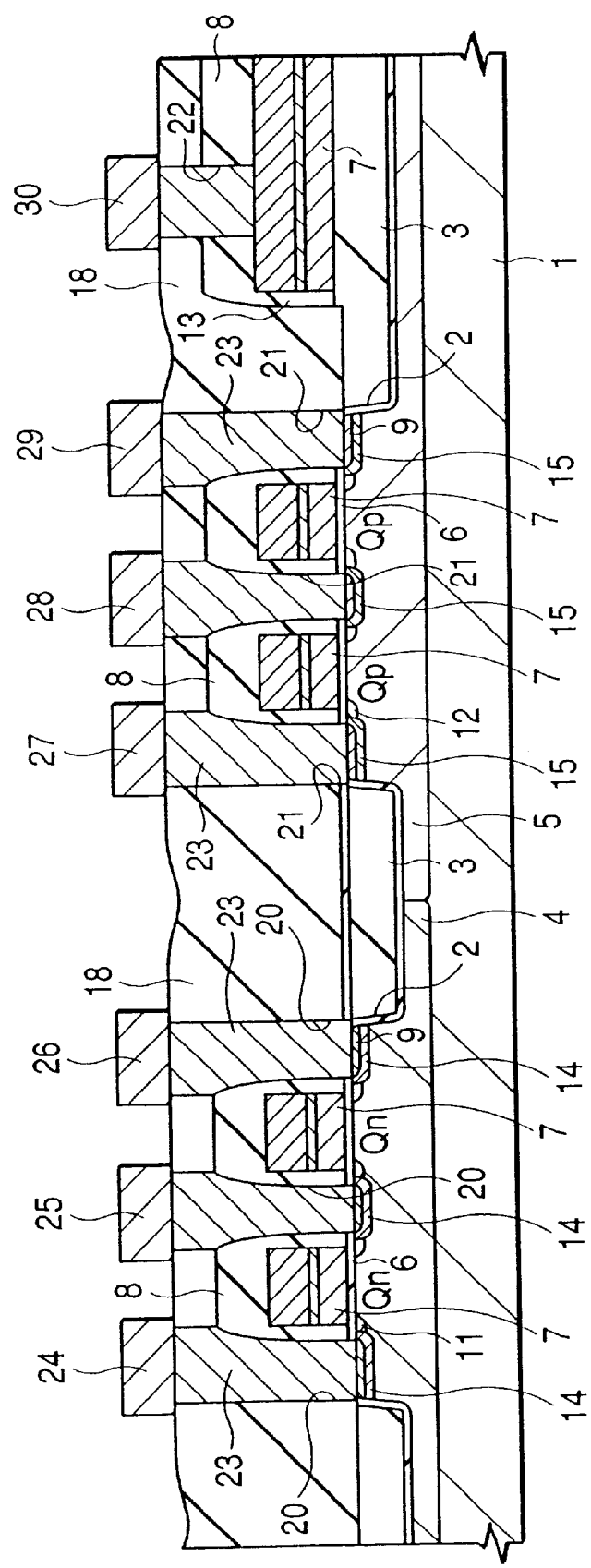
FIG. 5 is a sectional view of an essential part of a semiconductor substrate showing a fabrication process for a semiconductor integrated circuit device that is an embodiment of the present invention.

Then, as shown in FIG. 5, W interconnects 24 to 30 that constitute a first layer interconnection are formed on the silicon oxide film 18. In order to form the W interconnects 24 to 30, for example, a W film of a thickness of the order of 400 nm is deposited on the silicon oxide film 18 by a sputtering method and thereafter the W film 18 is dry-etched with a photoresist film as a mask. Of the first layer interconnects 24 to 30, the W interconnects 24 to 26 are electrically connected to a source and drains ($n^+$ type semiconductor region) of the n channel MISFET Qn through the contact holes 20 respectively, the W interconnects 27 to 29 are electrically connected to a source and drains (p+ type semiconductor regions) of p-channel MISFET Qp through the contact holes 21 respectively and the W interconnect 30 is electrically connected to the gate electrode 7 through the contact hole 22.

Figure 6A:
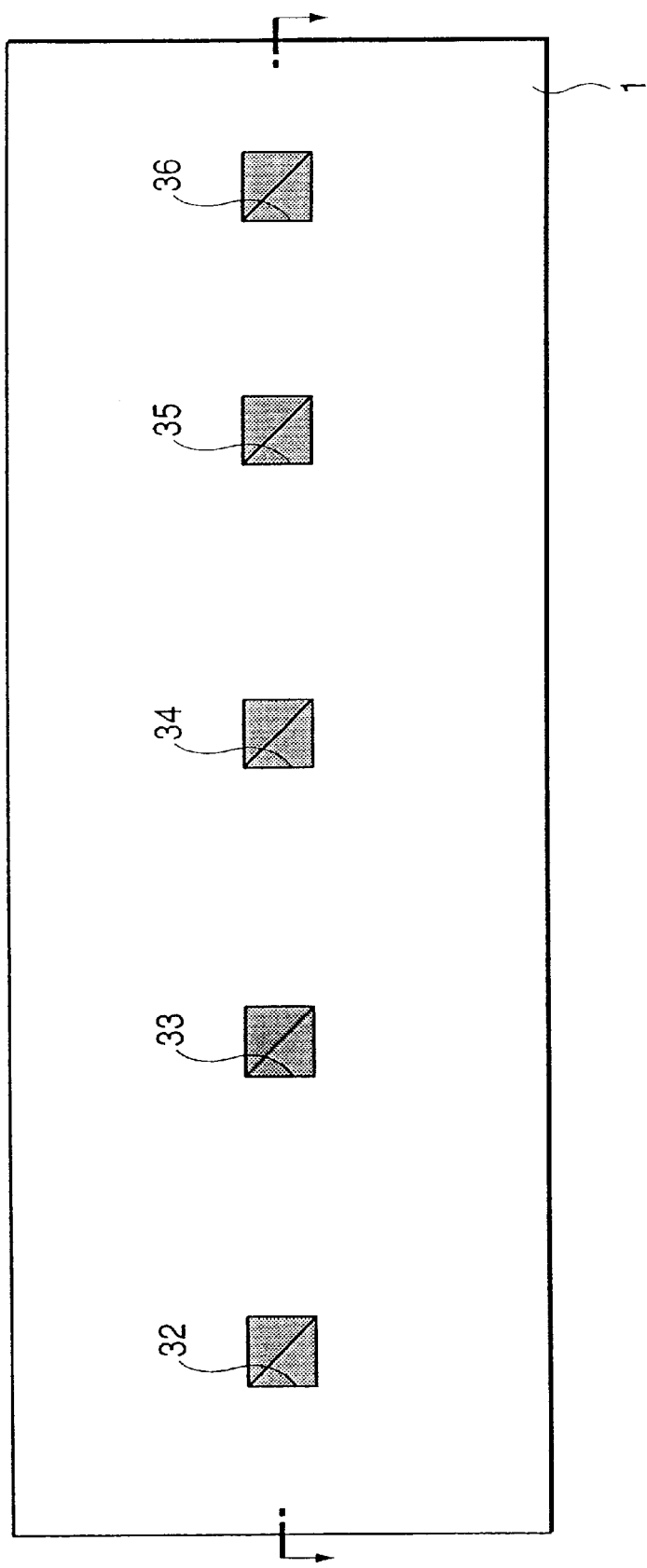
FIG. 6(A) is a plan view of an essential part of a semiconductor substrate showing a fabrication process for a semiconductor integrated circuit device that is an embodiment of the present invention and FIG. 6(B) is a sectional view of the essential part of a semiconductor substrate showing the fabrication process.
Figure 6B:
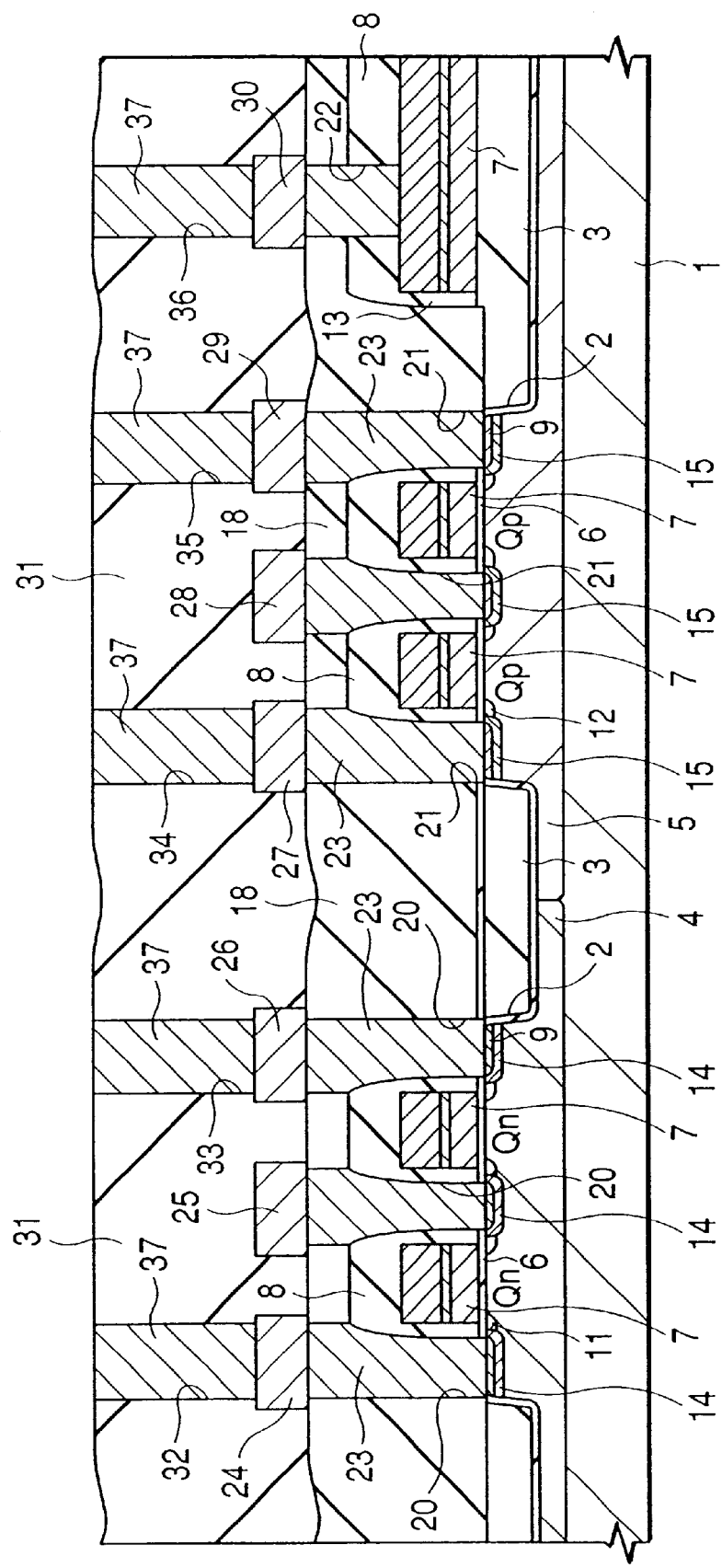

Then, as shown in FIGS. 6(A) and 6(B), a silicon oxide film 31 of a thickness of the order of 1200 nm is deposited above the W interconnects 24 to 30 of the first layer, subsequently through holes 32 to 36 are formed in the silicon oxide film 31 by dry etching with a photoresist film as a mask and thereafter, plugs 37 are formed in the interiors of the through holes 32 to 36.

The silicon oxide film 31 is deposited, for example, using ozone (or oxygen) and tetraethoxysilane (TEOS) as a source gas by a CVD method. The plugs 37 are formed, for example, using a W film by the same method as that in which the plugs 23 are formed in the interiors of the contact holes 20, 21 and 22.

Figure 7A:
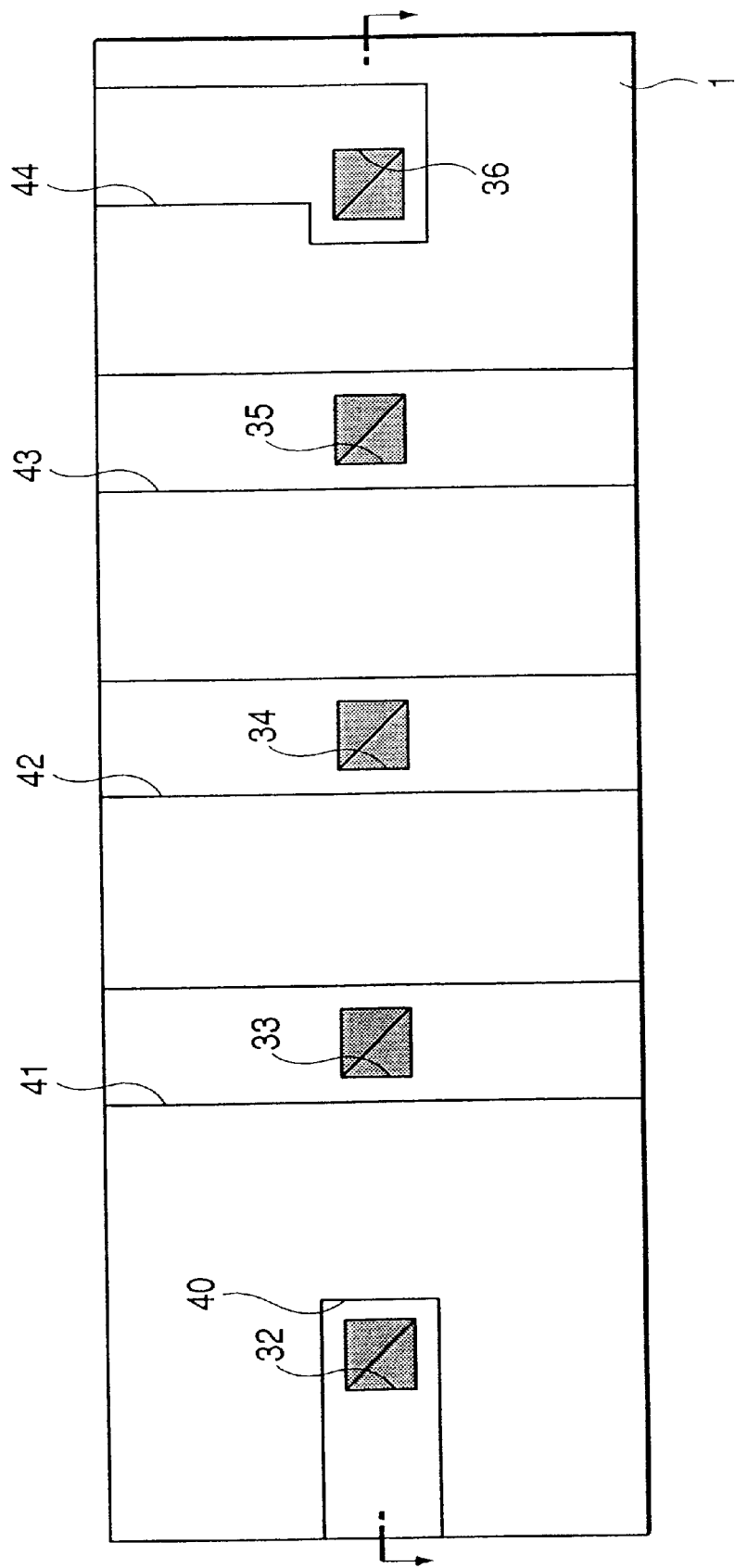
FIG. 7(A) is a plan view of an essential part of a semiconductor substrate showing a fabrication process for a semiconductor integrated circuit device that is an embodiment of the present invention and FIG. 7(B) is a sectional view of the essential part of a semiconductor substrate showing the fabrication process.
Figure 7B:
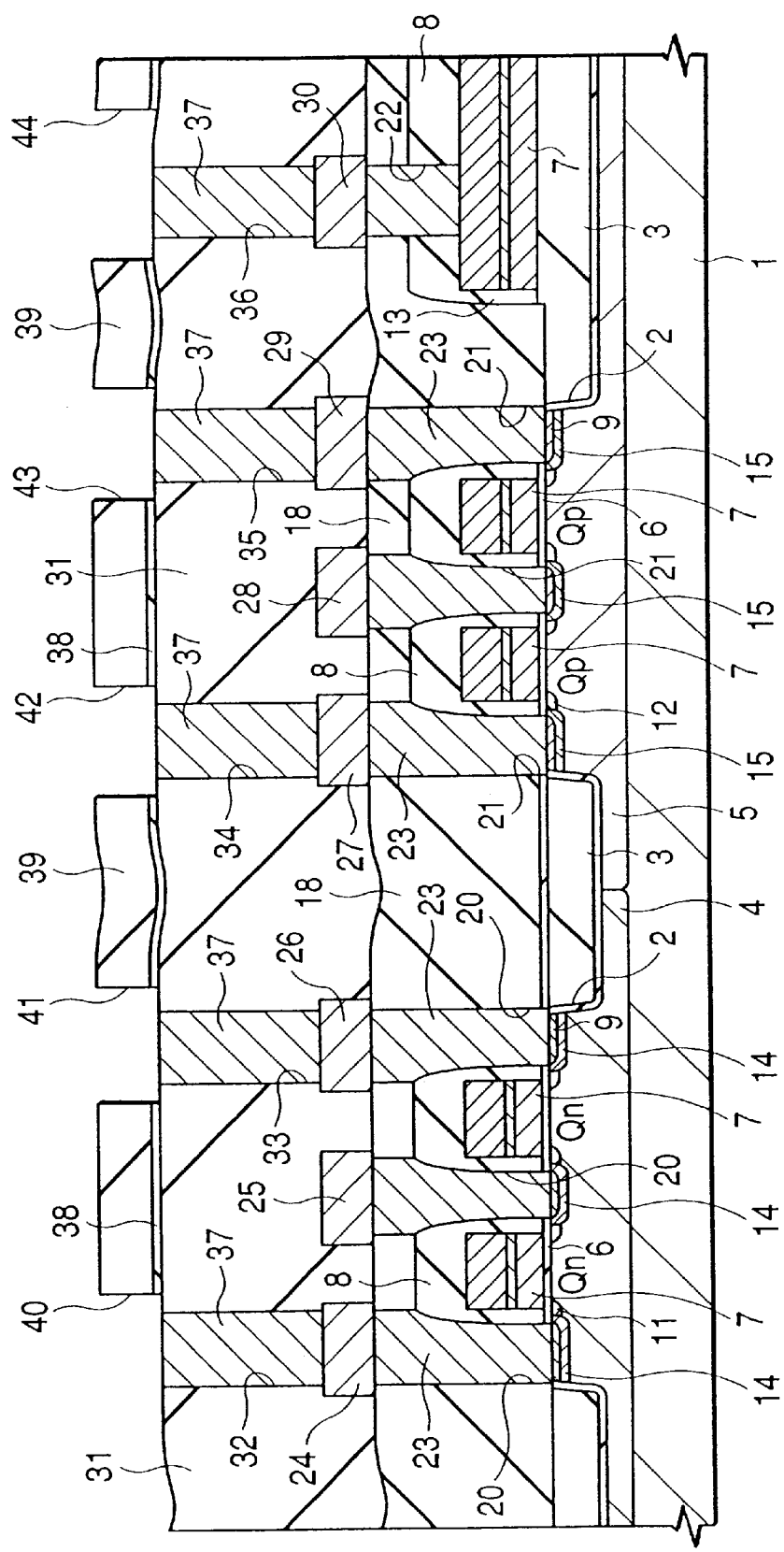

Then, as shown in FIGS. 7(A) and 7(B), a silicon nitride film 38 as thin as of the order of 50 nm in thickness is deposited on the silicon oxide film 31 by a plasma CVD method and subsequently, a silicon oxide film 39 of a thickness of the order of 350 nm on the silicon nitride film 38 by the plasma CVD. Thereafter, parts of the silicon oxide films 39 and the silicon nitride film 38 above the through holes 32 to 36 are removed by dry etching with a photoresist film as a mask to form interconnect trenches 40 to 44.

In order to form the interconnect trenches 40 to 44, the silicon oxide film 39 is selectively etched with the silicon nitride 38 as an etching stopper and then, the silicon nitride film 38 is etched. In this way, the thin silicon nitride film 38 is formed as the lower layer of the silicon oxide layer 39 in which the interconnect trenches are to be formed and etching is temporarily stopped at the surface of the silicon nitride film 38, then followed by removal of the silicon nitride film 38, so that depths of the interconnect trenches 40 to 44 can be controlled to good precision.

As will be described later, while embedded Cu interconnects are formed in the interiors of the interconnect trenches, a problem arises because of an interconnect delay time due to increase in parasitic capacitance between interconnects as a distance between adjacent interconnect trenches 40 to 44 becomes narrower. In order to suppress increase in parasitic capacitance between interconnects, the silicon oxide film 39 in which the interconnect trenches 40 to 44 are formed may preferably be constituted, for example, of any of silicon oxide-based insulating films of a dielectric constant ($\in$) of 3.0 or lower including a coat type insulating film such as an inorganic SOG film using hydrogen silsesquioxane as a source and an organic SOG film using a mixture of tetra alkoxy silane+alkyl alkoxy silane as a source; a fluorocarbon polymer film that is produced by a plasma CVD; and others.

Then, embedded Cu interconnection constituting of a second layer interconnection is formed in the interiors of the interconnect trenches 40 to 44 in the following process.

Figure 8:
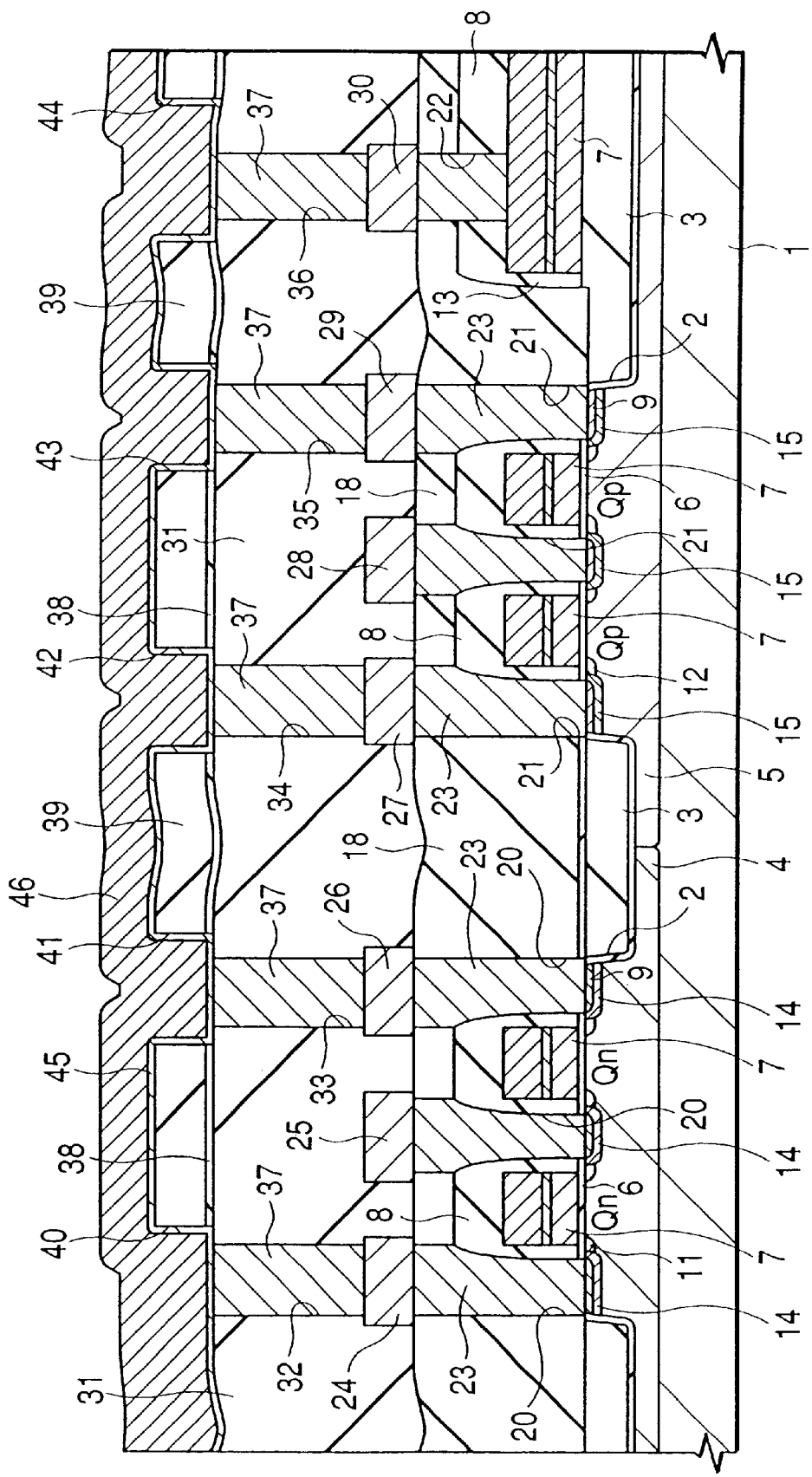
FIG. 8 is a sectional view of an essential part of a semiconductor substrate showing a fabrication process for a semiconductor integrated circuit device that is an embodiment of the present invention.

At first, as shown in FIG. 8, a TiN (titanium nitride) film 45 as thin as of the order of 50 nm in thickness is formed on the silicon oxide film 39 and in the interiors of the interconnect trenches 40 to 44 by a sputtering method and thereafter, a Cu film 46 that is sufficiently thicker (for example, of the order of 800 nm) than depths of the interconnect trenches 40 to 44 is deposited on the TiN film 45 by a sputtering method. Subsequently, the substrate 1 receives a heat treatment at a temperature of the order of 475° C. in a non-oxidizing atmosphere (for example, hydrogen atmosphere) to reflow the Cu film 46 and thereby, the interiors of the interconnect trenches 40 to 44 are filled with the Cu film 46 so that no gaps are left in the interiors.

When Cu interconnects are formed in the interconnect trenches 40 to 44, Cu diffuses into the silicon oxide film 39 and causes a short between interconnects and increase in parasitic capacitance between interconnects due to increase in dielectric constant of the silicon oxide film 39 since Cu has a nature to easily diffuse in a silicon oxide film. Besides, Cu is easy to be separated from the silicon oxide film 39 at the interface therebetween due to poor adhesiveness to an insulating material such as silicon oxide.

Accordingly, when Cu interconnects are formed in the interiors of the interconnect trenches 40 to 44, there is a necessity to form a barrier layer that suppresses diffusion of Cu, having a high adhesiveness to an insulating material, between the silicon oxide film 39 and the Cu film 46. Besides, when the interiors of the interconnect trenches 40 to 44 are filled with the Cu film 46 using the above described reflow sputtering method, there is another necessity to use a barrier layer having a property to improve a wettability of the Cu film 46 in the reflowing.

High melting point metal nitrides such as TiN, WN and TaN (tantalum nitride) that cause almost no reaction with Cu are a preferable material of a barrier layer. A material that is made by adding Si (silicon) to a high melting point metal nitride and high melting point metals such as Ta, Ti, W, Ti alloy which are hard to react with Cu can be used as a barrier layer.

A formation process for Cu interconnection which will be described below can be applied not only to when Cu interconnection is formed using a high purity Cu film, but to when Cu interconnection is formed using an alloy containing Cu as a main component. Here, an alloy containing Cu as a main component means an alloy in which weight percentage of Cu in the materials which compose the alloy is larger than the weight percentage of any other material in the alloy.

Figure 9:
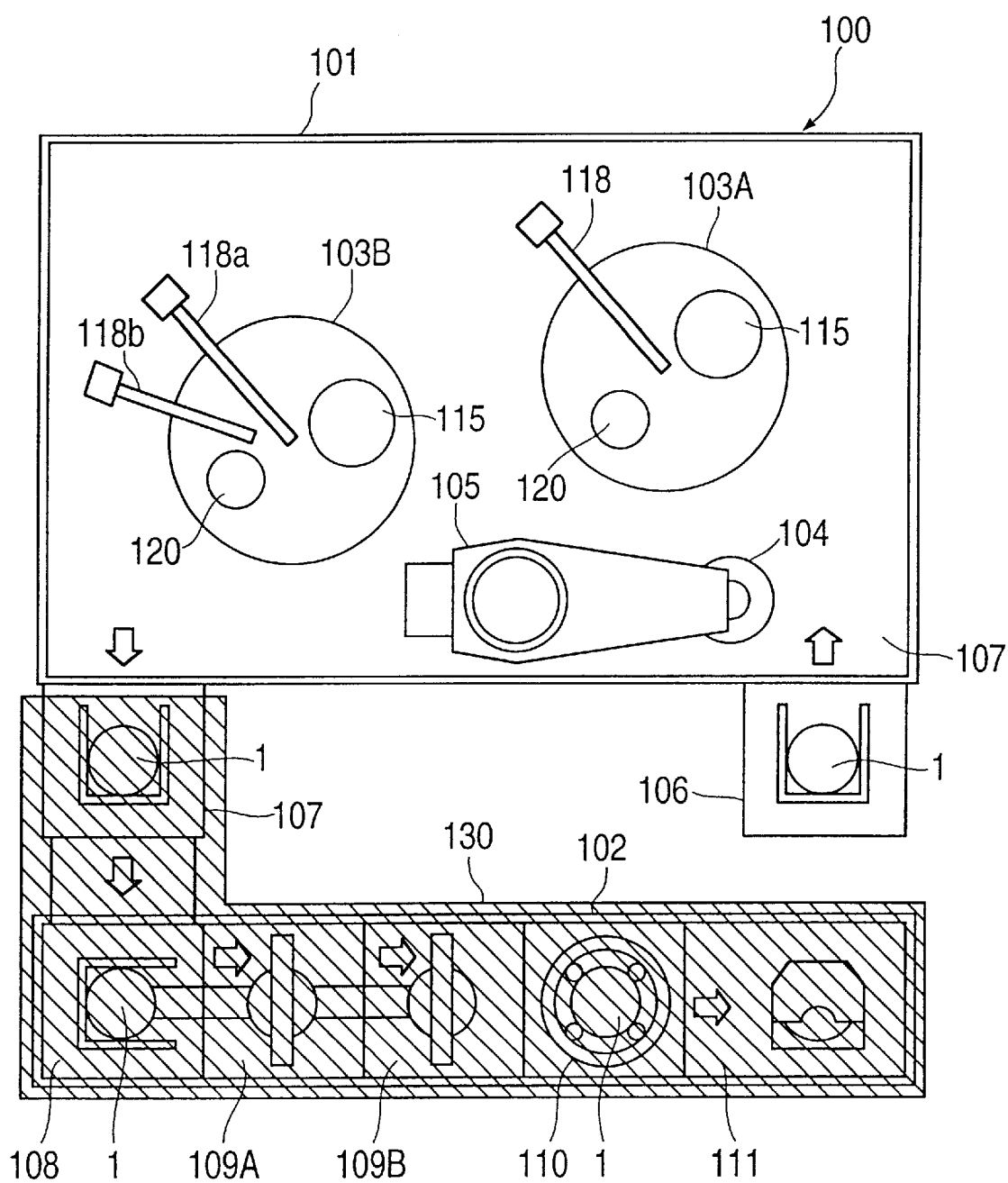
FIG. 9 is a schematic view showing an example of an overall construction of a CMP apparatus which is used for formation of embedded Cu interconnection.

FIG. 9 is the schematic view showing an example of an overall construction of a CMP apparatus which is used for formation of embedded Cu interconnection.

As shown in the figure, the CMP apparatus 100 comprises: a polishing section 101; and an after-cleaning section 102. The polishing section 101 comprises: two tables (a first table 103A, a second table 103B) performing polishing of wafers (substrates) 1; a clean station 104 at which a wafer 1 that has been finished with the polishing is cleaned preliminarily and an anticorrosive processing is applied on the surface of the wafer 1; and an rotary arm 105 that moves the wafer 1 through a loader 106, through the first table 103A, through the second table 103B, and through the clean station 104 to an unloader 107.

At a rear stage of the polishing section 101, there is provided an after-cleaning section 102 at which surfaces of the wafer 1 that has been finished with the preliminary cleaning are scrub cleaned. The after-cleaning section 102 comprises: a loader 108; a first cleaning section 109A; a second cleaning section 109B; a spin dryer 110; an unloader 111; and others. Furthermore, the after-cleaning section 102 is fully surrounded with a light shield wall 130 in order to prevent the surfaces of the wafer 1 from being illuminated with light and thereby, the interior thereof is kept in a state of a dark room with an illumination of 180 lux or less, or preferably 100 lux or less. This is because when the wafer 1 on the surface of which a polishing liquid is left behind is illuminated with light in a wet condition, a short current flows through a pn junction by a photoelectromotive force of silicon and Cu ions are dissociated from a surface of a Cu interconnect connected to the p-side (+ side) of the pn junction to causes the interconnect to be corroded.

Figure 10:
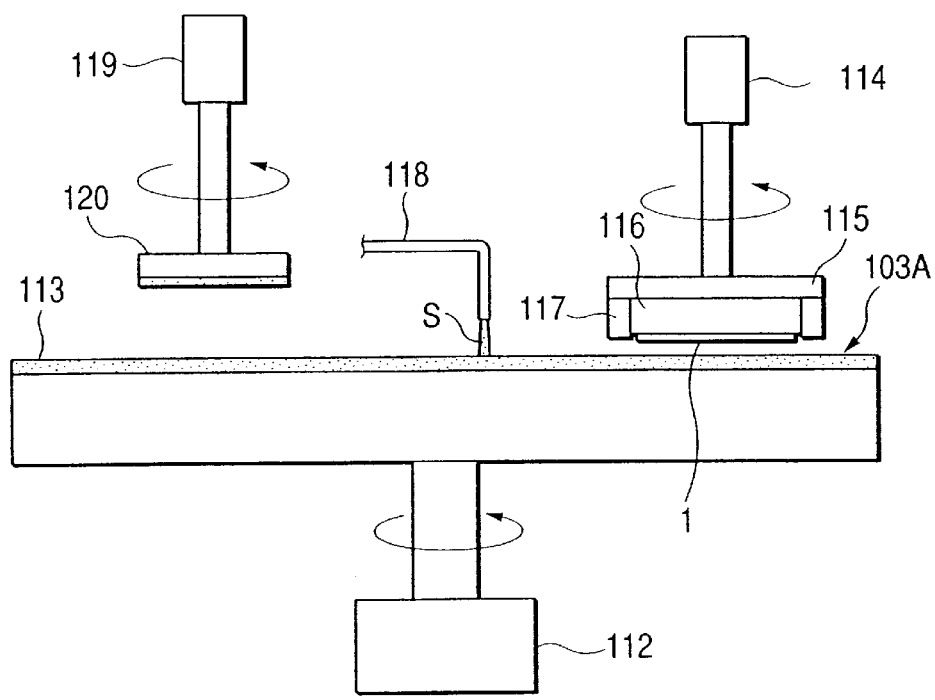
FIG. 10 is a schematic view showing part of a CMP apparatus used for formation of embedded Cu interconnection.
Figure 11:
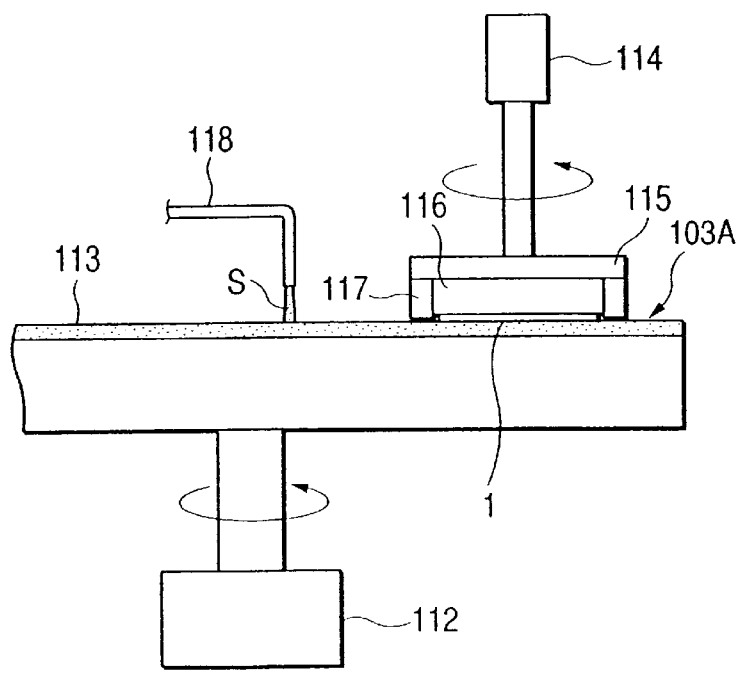
FIG. 11 is a schematic view of a CMP apparatus showing a polishing state of a Cu film.

As shown in FIG. 10, the table 103A is driven to rotate in a horizontal plane by a drive mechanism 112 equipped in the lower part thereof. A polishing pad 113 is fixedly held on the upper surface of the first table 103A, wherein the polishing pad 113 is formed by sticking synthetic resin such as polyurethane having many pores on the surface thereof on the surface of the first table 103A. There is provided a wafer carrier 115 that is moved vertically and driven to be rotated in a horizontal plane by a drive mechanism 114. A wafer 1 is retained by a wafer chuck 116 and a retainer ring 117 that are mounted on the lower end of the wafer carrier 115 with a main surface (a surface to be polished) of the wafer 1 facing downwardly and pressed to the polishing pad 113 under a prescribed load. A slurry (polishing liquid) S is supplied into a gap between the surface of the polishing pad 113 and the to-be-polished surface of the wafer 1 through a slurry supply tube 118 and the to-be-polished surface of the wafer 1 is chemically and mechanically polished. A dresser 120 is provided above the first table 103A, which dresser 120 is not only moved vertically but also driven to be rotated in a horizontal plane by a drive mechanism 119. A base member on which diamond particles are electroplated is mounted on the lower end of the dresser 120 and the surface of the polishing pad 113 is at regular intervals ground by the base member in order to prevent porosity of the surface of the polishing pad 113 from being loaded or stuffed with abrasive grains. The second table 103B has almost the same construction as that of the first table 103A with the exception that two slurry supply tubes 118a and 118b are provided.

In order to form Cu interconnection using the CMP apparatus 100, a wafer 1 which is accommodated in the loader 106 is transported into the polishing section 101 using the rotary arm 105 and the wafer 1 receives chemical mechanical polishing (abrasive-grain-free chemical mechanical polishing) in which a slurry with no abrasive grains therein is used on the first table 103A (CMP of the first step) to remove the Cu film 46 outside the interconnect trenches 40 to 44.

The abrasive-grain-free chemical mechanical polishing used here means chemical mechanical polishing in which a polishing liquid (slurry) of an abrasive grain content less than 0.5 wt % is used, the abrasive grains being made of alumina, silica or the like, and an abrasive grain content of the polishing liquid is especially preferred to be less than 0.1 wt %, or more preferred to be less than 0.01 wt %. This weight percent is the weight of the abrasive grains to the combined weight of liquid and abrasive grains.

Figure 13:
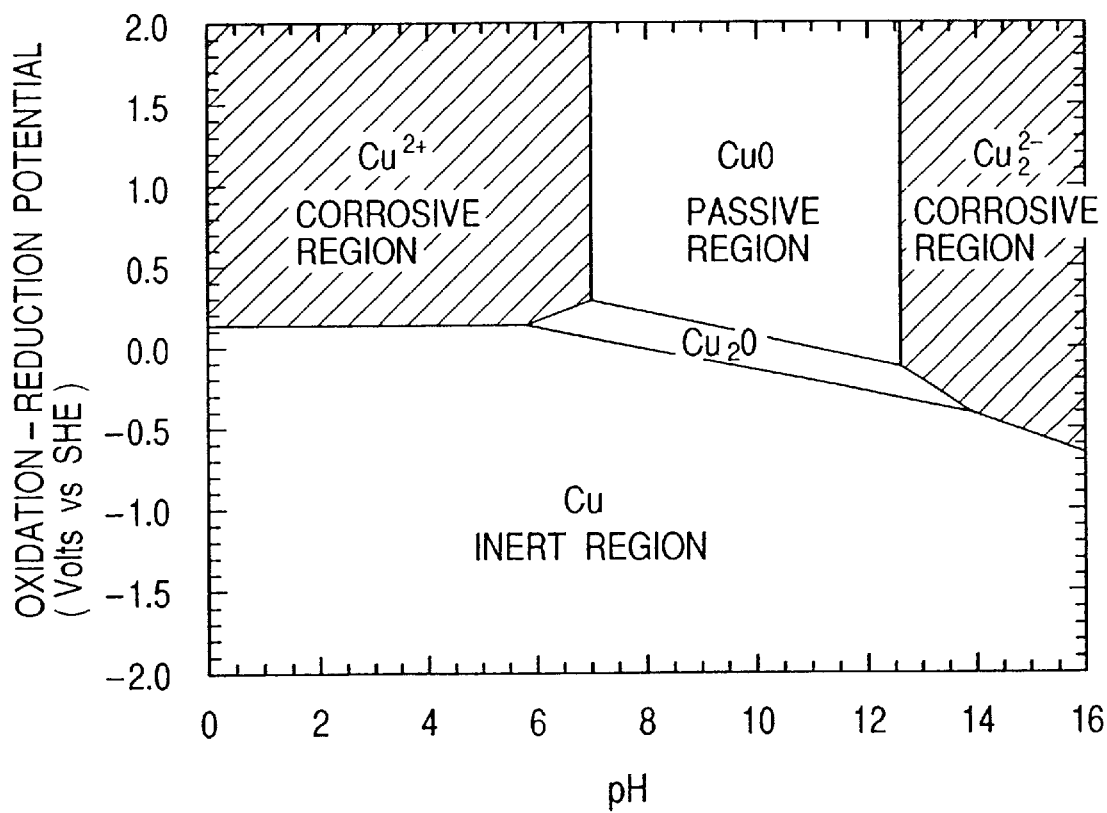
FIG. 13 is a graph showing pH vs. oxidation-reduction potential characteristics of Cu.
Figure 14A:
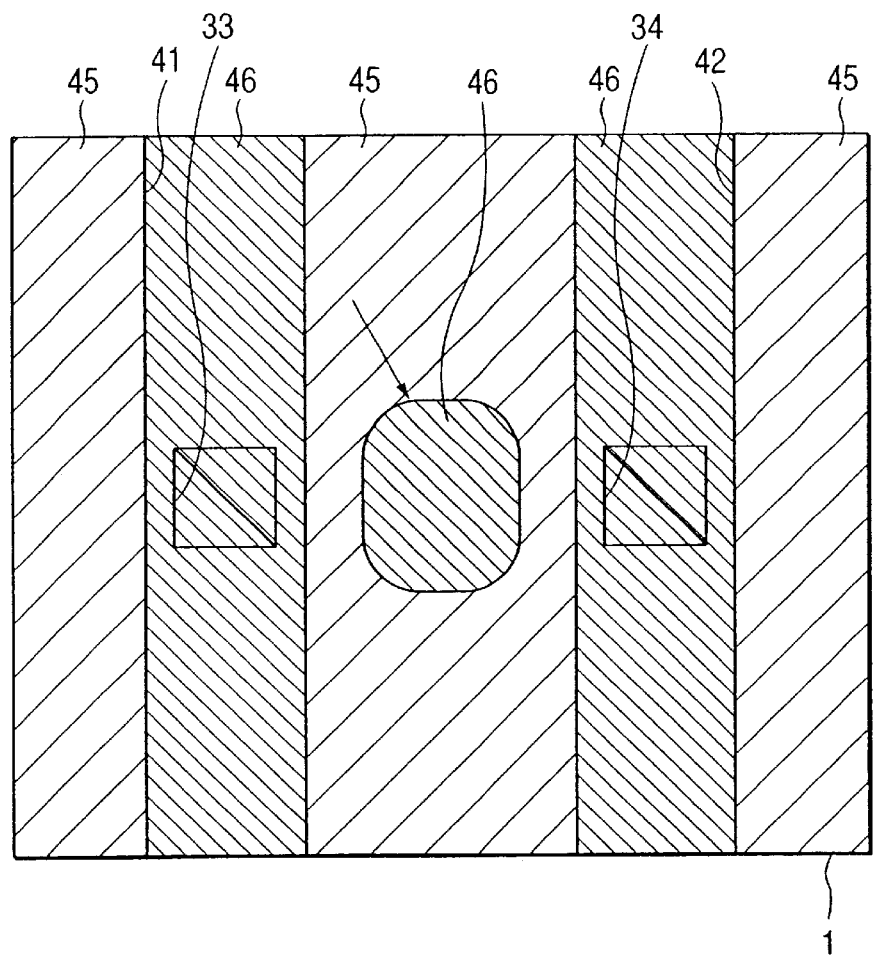
FIG. 14(A) is a plan view of an essential part of a semiconductor substrate showing a fabrication process for a semiconductor integrated circuit device that is an embodiment of the present invention and FIG. 14(B) is a sectional view of the essential part of a semiconductor substrate showing the fabrication process.
Figure 14B:
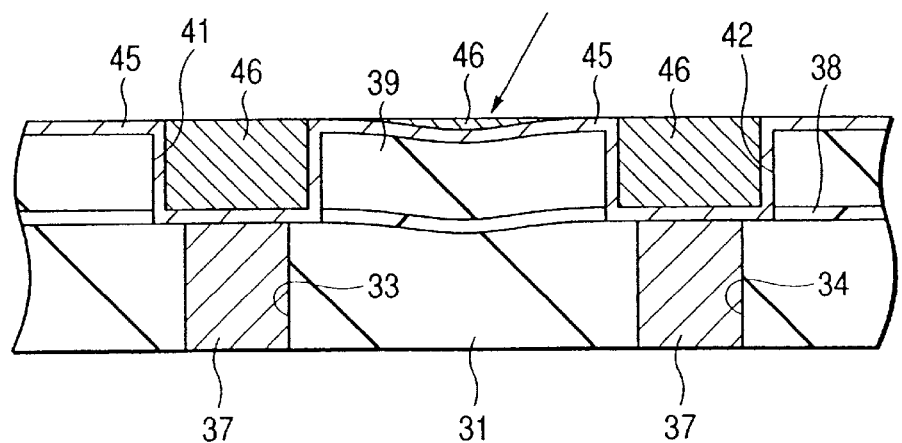
Figure 16A:
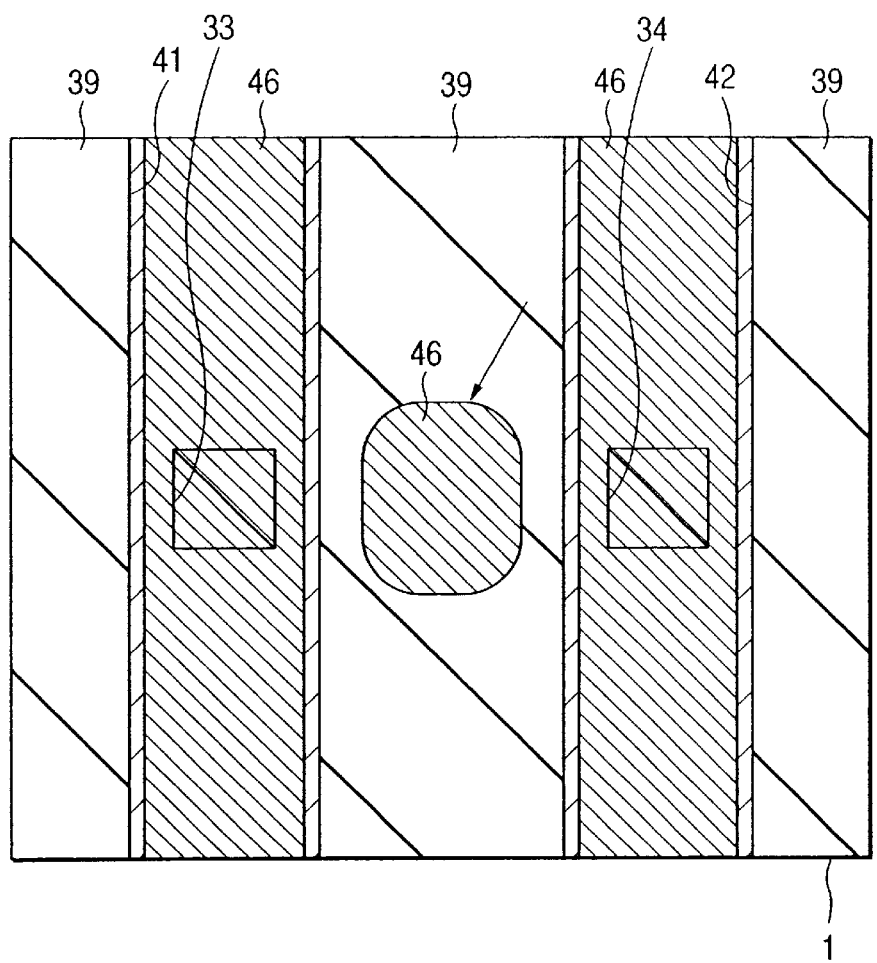
FIG. 16(A) is a plan view of an essential part of a semiconductor substrate showing a fabrication process for a semiconductor integrated circuit device that is an embodiment of the present invention and FIG. 16(B) is a sectional view of the essential part of a semiconductor substrate showing the fabrication process.
Figure 16B:
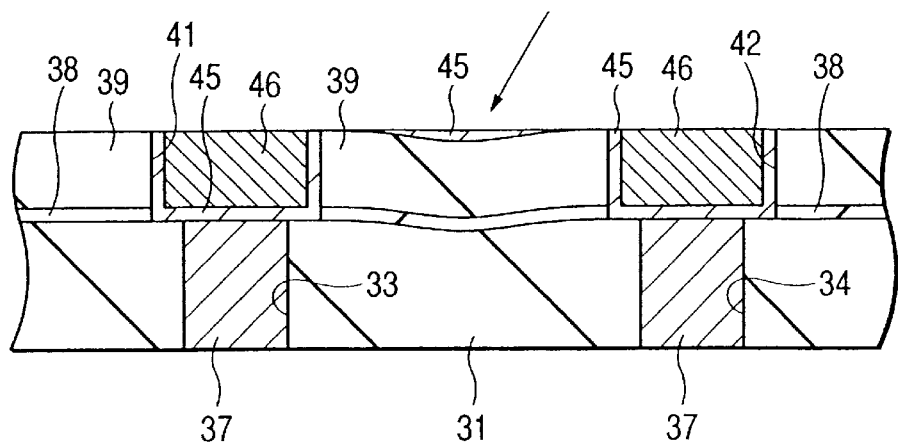

Furthermore, a polishing liquid is used with a value of pH thereof being adjusted in a corrosive range of Cu shown in FIG. 13 and the polishing liquid is used with a composition thereof being adjusted so that a polishing selectivity ratio of the Cu film 46 to the TiN film 45 (barrier layer) is 5 or more, more preferably 8 or more, or still more preferably 10 or more. In a case of Cu, if parameters are under conditions of pH<7 and an oxidation-reduction potential>0.2 as shown in the figure, Cu is dissolved as $Cu^{2+}$ ions. If pH>12.5, Cu is dissolved as $Cu_2^{2+}$. Accordingly, in a case where Cu is polished, parameters desirably reside in one of the corrosive regions. However, the example of the figure is in the $H_2O$ system and ranges of the corrosive regions are changed when another reactant is included in a polishing liquid. The corrosive regions shown in this embodiment are defined on the basis of whether or not a polishing liquid including such additives includes materials which provide a polishing liquid in a combined range of values of pH and an oxidation-reduction potential that corrodes a metal. Here, corrosive range means the range based on the graph of oxidation-reduction potential versus pH in which corrosion occurs. As the example, FIG. 13 shows the corrosive range in which corrosion occurs.

As such polishing liquids, there can be exemplified slurries each including an oxidizing agent and an organic acid. As oxidizing agents, there can be exemplified: hydrogen peroxide; ammonium hydroxide; ammonium nitrate; ammonium chloride; and others. As organic acids, there can be exemplified: citric acid; malonic acid; fumaric acid; malic acid; adipic acid; benzoic acid; phthalic acid; tartaric acid; lactic acid; succinic acid and others. Among them, since hydrogen peroxide does not contain a metal component and is not a strong acid, hydrogen peroxide is a preferable oxidizing agent for a polishing liquid. Since citric acid is generally used as a food additive as well, has a low toxicity, is not harmful as a waste liquid, has no smell and has a high solubility in water, the acid is a preferable organic acid for use in a polishing liquid. In this embodiment, for example, a polishing liquid is prepared in such a way that pure water is added with a 5 vol. % of hydrogen peroxide and 0.03 wt % of citric acid and further mixed with a content of 0.01 wt % of abrasive grains.

When chemical mechanical polishing is conducted using the above described polishing liquid, a Cu surface is first oxidized by an oxidizing agent, thereby forming a thin oxide layer on the surface. Thereafter, when a material that dissolves the oxide into water is supplied, the oxide layer is dissolved as an aqueous solution and the oxide layer is thinned. A part which has thus been thinned is again exposed to the oxidizing agent to increase a thickness thereof and such series of reactions are repeated to progress chemical mechanical polishing.

Conditions of polishing are, for example, such that a load=250 g/cm², a rotation number of wafer carrier=30 rpm, a table rotation number=25 rpm, a slurry flow rate=150 cc/min and a polishing pad in use is a hard pad (IC1400) made by Rodel Co. of USA. A final point of polishing is at a time point when the Cu film 46 is removed and the TiN film that is a underlying layer thereof is exposed and the final point is detected by detecting a signal intensity of a torque of a table or a wafer carrier when a polishing object is changed to the TiN film 45 from the Cu film 46. Alternatively, another way may be adopted that a hole is opened in a part of the polishing pad and a final point is detected on the basis of a change in spectrum of a reflecting light beam from the wafer surface, or on the basis of a change in optical spectrum associated with a property of the slurry.

Figure 12:
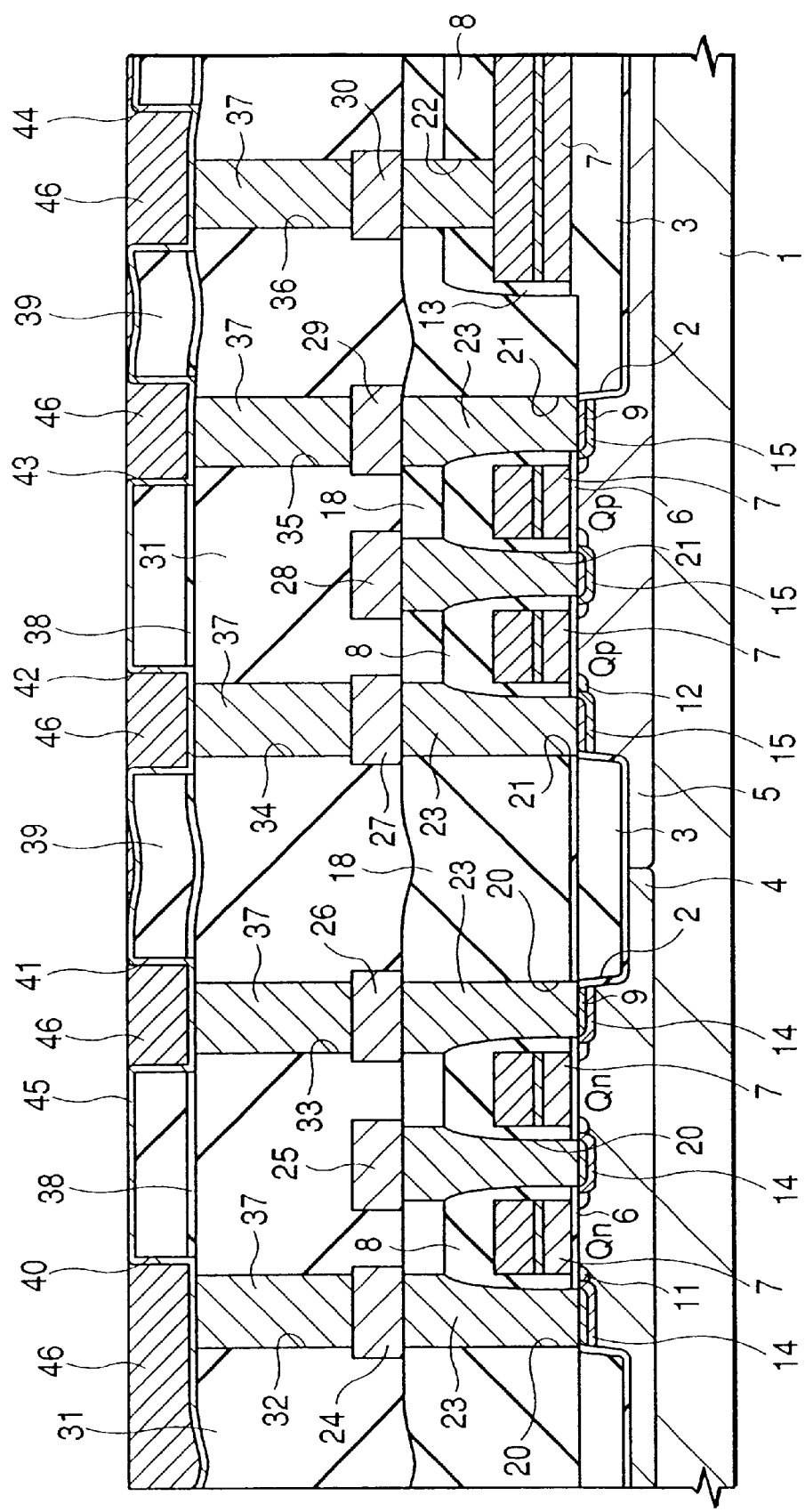
FIG. 12 is a sectional view of an essential part of a semiconductor substrate showing a fabrication process for a semiconductor integrated circuit device that is an embodiment of the present invention.

As shown in FIG. 12, when the abrasive-grain-free chemical mechanical polishing is adopted, almost all the Cu film 46 outside the interconnect trenches 40 to 44 is removed to expose the TiN film 45 that is an underlying layer of the Cu film 46. As shown in an enlarged view of FIGS. 14(A) and 14(B), part of the Cu film 46 that has not been removed remains in a dimple (pointed by an arrow mark) or the like on the TiN film 45 that is caused by a step profile of the upper surface of the underlying layer.

Then, in order to remove the TiN film 45 outside the interconnect trenches 40 to 44 and part of the Cu film that is locally left behind on the upper surface of the TiN film 45, the wafer 1 is transferred to the second table 103B from the first table 103A and chemical mechanical polishing using a polishing liquid (slurry) (with-abrasive-grain chemical mechanical polishing: CMP of the second step) is effected. With-abrasive-grain chemical mechanical polishing used here means chemical mechanical polishing using a polishing liquid containing 0.5 wt % of more of abrasive grains such as alumina powder and silica powder. In this embodiment, a polishing liquid in use contains 5 vol. % of hydrogen peroxide; 0.03 wt % of citric acid and 0.5 wt % of abrasive grains dissolved and dispersed in pure water but there is no specific limitation to this polishing liquid. This polishing liquid is supplied to the polishing pad 113 on the second table 103B through the slurry supply tube 118a.

In this with-abrasive-grain chemical mechanical polishing, removal of part of the Cu film 46 remaining locally on the upper surface of the TiN film 45 is followed by removal of the TiN film 45 outside the interconnect trenches 40 to 44. At this stage, a condition is set in which a polishing selectivity ratio of the Cu film 46 to the TiN film 45 (barrier layer) is adjusted to be lower than that of the abrasive-grain-free chemical mechanical polishing, for example, a polishing selectivity of 3 or lower and polishing off of the surface of the Cu film 46 in the interiors of the interconnect trenches 40 to 44 is suppressed.

Conditions for polishing are, for example, such that a load=120 g/cm², a rotation number of wafer carrier=30 rpm, a table rotation number=25 rpm, a slurry flow rate=150 cc/min and a polishing pad in use is IC1400 made by Rodel Co. A polishing quantity is set so as to correspond to a thickness of the TiN film and a final point of the polishing is controlled on the basis of a time calculated from a thickness of the TiN film 45 and a polishing speed.

Figure 15:
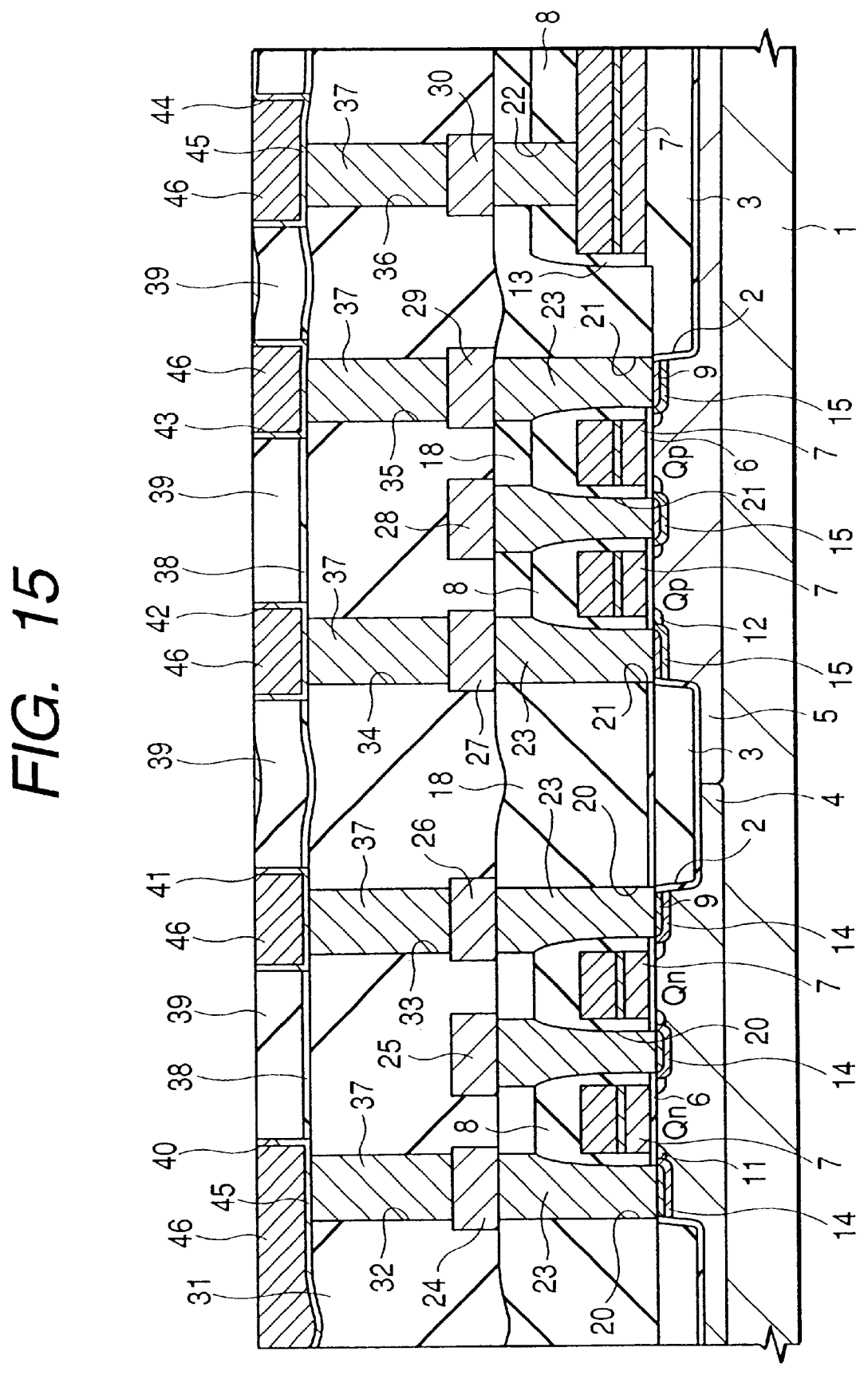

As shown in FIG. 15, when the with-abrasive-grain chemical mechanical polishing is adopted, almost all the TiN film 45 outside the interconnect trenches 40 to 44 is removed to expose the silicon oxide film 39 that is an underlying layer of TiN film 45. As shown in an enlarged view in FIGS. 16(A) and 16(B), part of the TiN film 46 that has not been removed is left behind in a dimple (pointed by an arrow mark) or the like of the silicon oxide film 39 that is caused by a step profile of the upper surface of the underlying layer and the like.

Then, polishing of the Cu film 46 in the interconnect trenches 40 to 44 is suppressed to the lowest level possible and in such a condition, selective chemical mechanical polishing (CMP of the third step) is conducted to remove part of the TiN film 45 locally left behind on the silicon oxide film 39 outside the interconnect trenches 40 to 44. The selective chemical mechanical polishing is conducted in such a manner that a polishing selectivity ratio of the TiN film 45 to the Cu film 46 is 5 or higher, or more preferably 10 or higher, or still more preferably 15 or higher. This chemical mechanical polishing is conducted in another condition in which a polishing selectivity ratio of the silicon oxide film 39 to the Cu film 46 is higher than 1.

In order to conduct the selective chemical mechanical polishing, a polishing liquid is used that is prepared by adding an anticorrosive to a polishing liquid having a content of abrasive grains of 0.5 wt % or more as used in the with-abrasive-grain chemical mechanical polishing. An anticorrosive used here means a chemical that prevents or suppresses progress in polishing on the Cu film 46 by forming an anticorrosive, protective film on the surface thereof and as anticorrosives, BTA derivatives such as benzotriazole (BTA), BTA carboxylic acid; dodecylmercaptan; triazole; tolyl triazole; and others are used and especially when BTA is used, a stable protective film can be attained.

When BTA is used as an anticorrosive, three ways of addition thereof are sufficiently effective: BTA is generally in the range of 0.001 to 1 wt %, more preferably in the range of 0.01 to 1 wt %, or still more preferably in the range of 0.1 to 1 wt %, though concentrations are dependent on a kind of a slurry. In this embodiment, a polishing liquid in use is prepared by adding 0.1 wt % of BTA as an anticorrosive into a polishing liquid used in the with-abrasive-grain chemically mechanical polishing of the second step but there is no specific limitation to this polishing liquid. Furthermore, in order to avoid reduction in a polishing speed due to addition of an anticorrosive, the following chemicals may be added: polyacrylic acid, polymethacrylic acid, ammonium salts thereof, ethylenediaminetetraacetic acid (EDTA) and others. Chemical mechanical polishing using such a slurry including an anticorrosive is detailed in the publications of Unexamined Japanese Patent Application Nos. Hei 10-209857, Hei 9-299937 and Hei 10-317233 invented by the present inventors.

This selective chemical mechanical polishing (CMP of the third step) is conducted on the second table 103B, subsequently following completion of the with-abrasive-grain chemical mechanical polishing (CMP of the second step) described above. The polishing liquid into which an anticorrosive has been added is supplied through the slurry supply tube 118b to the surface of the polishing pad 113. Conditions of polishing are, for example, such that a load= 120 g/cm$^2$, a rotation number of wafer carrier=30 rpm, a table rotation number=25 rpm, a slurry flow rate=190 cc/min.

Figure 17:
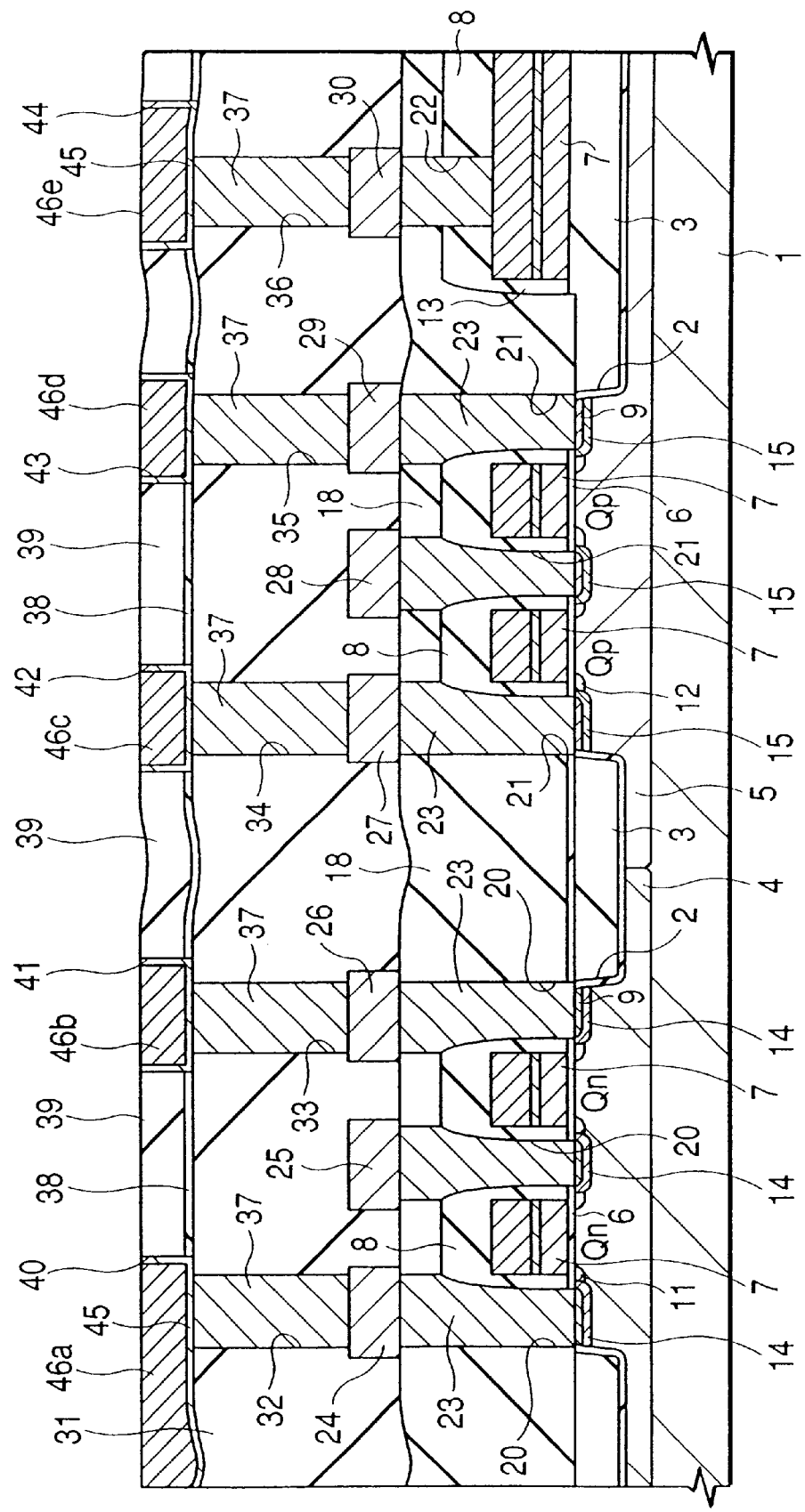
FIG. 17 is a sectional view of an essential part of a semiconductor substrate showing a fabrication process for a semiconductor integrated circuit device that is an embodiment of the present invention.
Figure 18A:
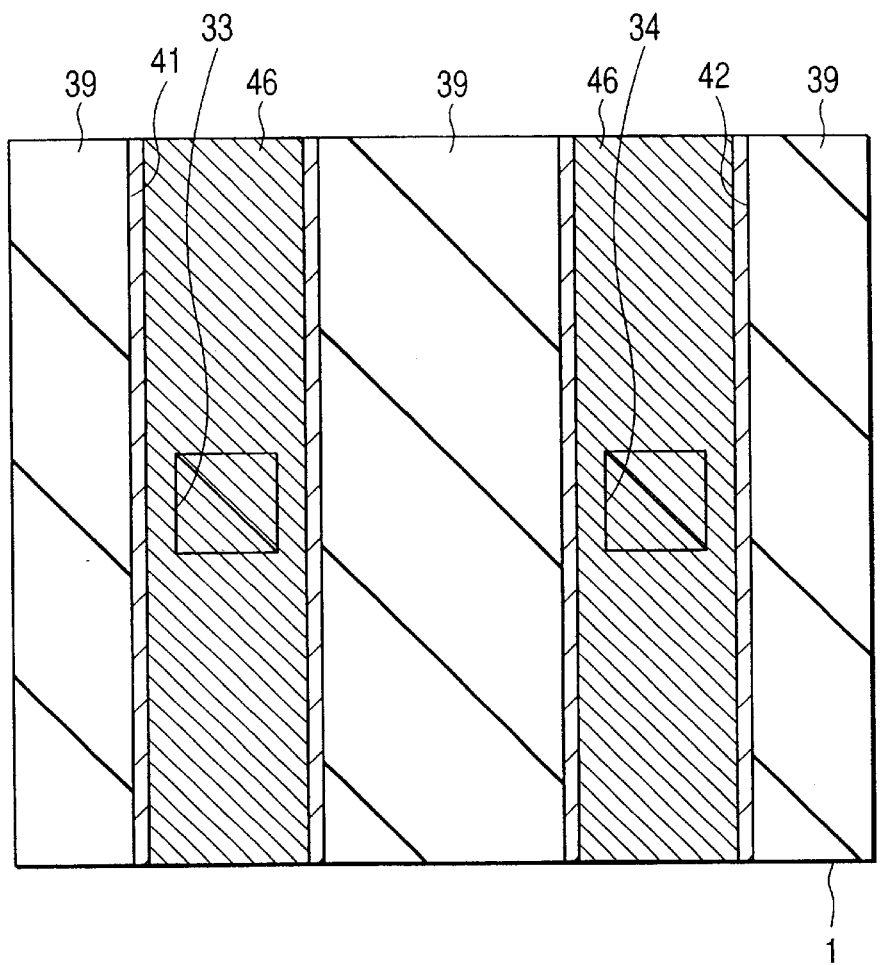
FIG. 18(A) is a plan view of an essential part of a semiconductor substrate showing a fabrication process for a semiconductor integrated circuit device that is an embodiment of the present invention and FIG. 18(B) is a sectional view of the essential part of a semiconductor substrate showing the fabrication process.
Figure 18B:
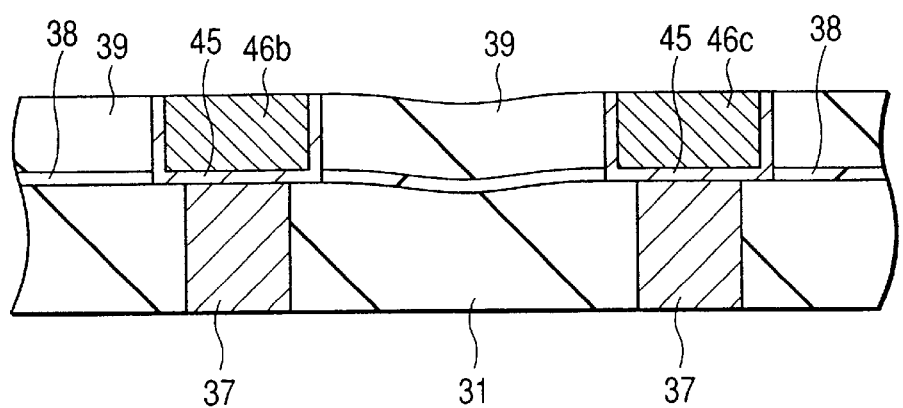

As shown in FIGS. 17, 18(A) and 18(B), by conducting the selective chemical mechanical polishing, all the TiN film 45 outside the interconnect trenches 40 to 44 are removed, thereby, forming the embedded Cu interconnects 46a to 46e in the interiors of the interconnect trenches 40 to 44.

Slurry residue containing particles such as abrasive grains and metal particles such as particles of Cu oxide is attached to surfaces of the wafer 1 on which the embedded Cu interconnect trenches 46a to 46e have been formed. In order to remove the slurry residue, the wafer 1 is first cleaned using pure water containing BTA at the clean station 104 shown in FIG. 9. At this time, megasonic cleaning may be used together with ordinary cleaning, the megasonic cleaning isolates the slurry residue from the surface of the wafer 1 with application of high frequency of 800 kHz or higher to the cleaning solution. Then, the wafer 1 which is kept in a wet state in order to prevent the wafer surface from being dried is transported to the after-cleaning section 102 from the polishing section 101, in the first cleaning section 109A of which the wafer 1 is subjected to scrub cleaning using a cleaning solution containing 0.1 wt % of NH$_4$OH and subsequently, the wafer 1 further receives scrub cleaning using pure water in the second cleaning section 109B. As described above, the entire structure of the after-cleaning section 102 is covered with the light shield wall 130 in order to prevent corrosion of the Cu interconnects 46a to 46e due to illumination of the surfaces of the wafer 1 with light during the cleaning.

In the above described scrub cleaning, for example, as shown in FIG. 19, the wafer rotating in a horizontal plane are sandwiched at both surfaces thereof by cylindrical brushes 121A and 121B made of a porous mass of synthetic resin like PVA (polyvinyl alcohol) and both surfaces of the wafer 1 are cleaned at the same time while the brushes 121A and 121B are rotated in a plane perpendicular to a surface of the wafer 1. At this time, megasonic cleaning may be adopted while high frequency of 800 kHz or higher is applied to the cleaning solution, after the scrub cleaning with the rotary brushes, in order to isolate the slurry residue on the surfaces of the wafer 1.

Figure 20:
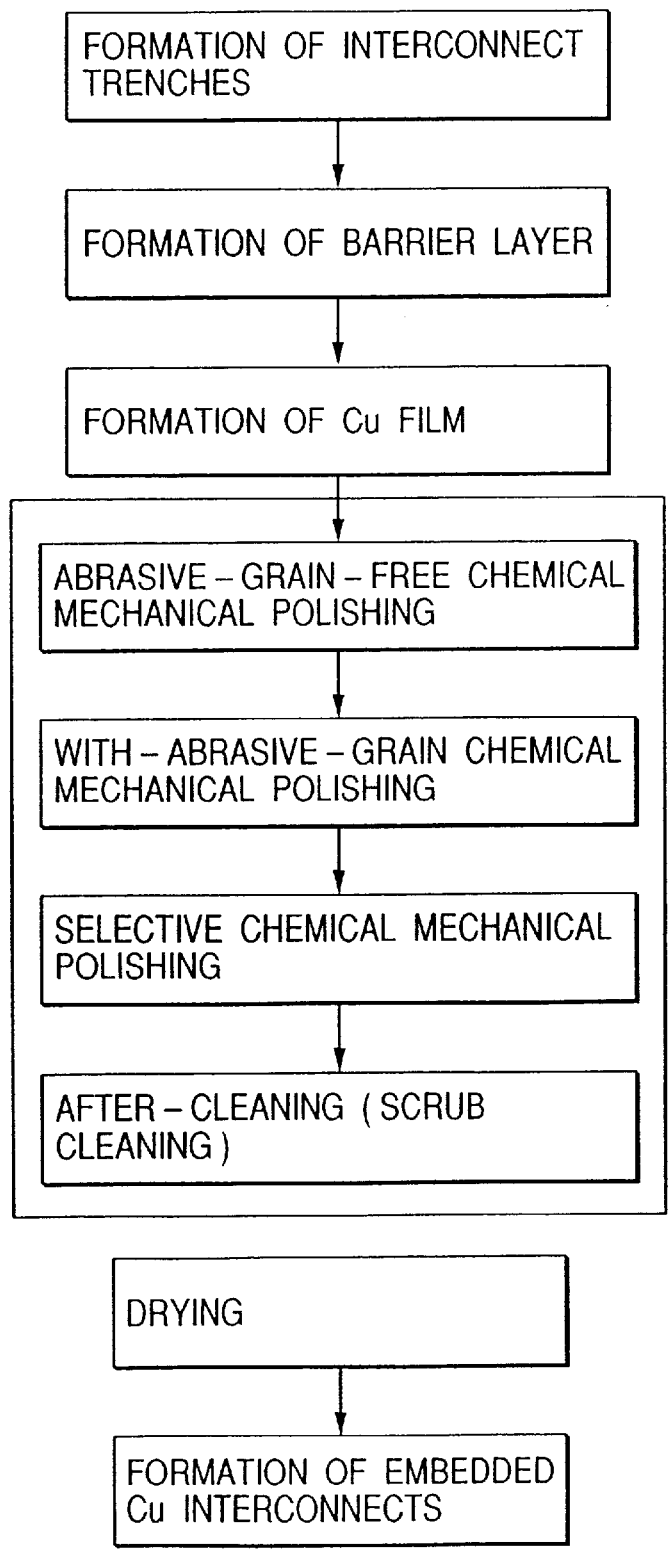
FIG. 20 is a flowchart showing a fabrication process for a semiconductor integrated circuit device that is an embodiment of the present invention.

The wafer 1 which has been finished with the scrub cleaning (after-cleaning) is dried with the spin dryer 110 and thereafter, the wafer 1 is transported to a next step and embedded Cu interconnects are formed in a way similar to the above described in the third layer and the upper layers following the third layer. FIG. 20 is an overall flow of a formation process for the Cu interconnects 46a to 46e.

According to the embodiments forming the embedded Cu interconnects 46a to 46e by means of the abrasive-grain-free chemical mechanical polishing, the with-abrasive-grain chemical mechanical polishing and the selective chemical mechanical polishing, over-polishing performed in order to remove the Cu film 46 and the TiN film 45 outside the interconnect trenches 40 to 44 is only required to a small extent. Hence, occurrence of dishing and erosion can be suppressed.

Figure 21:
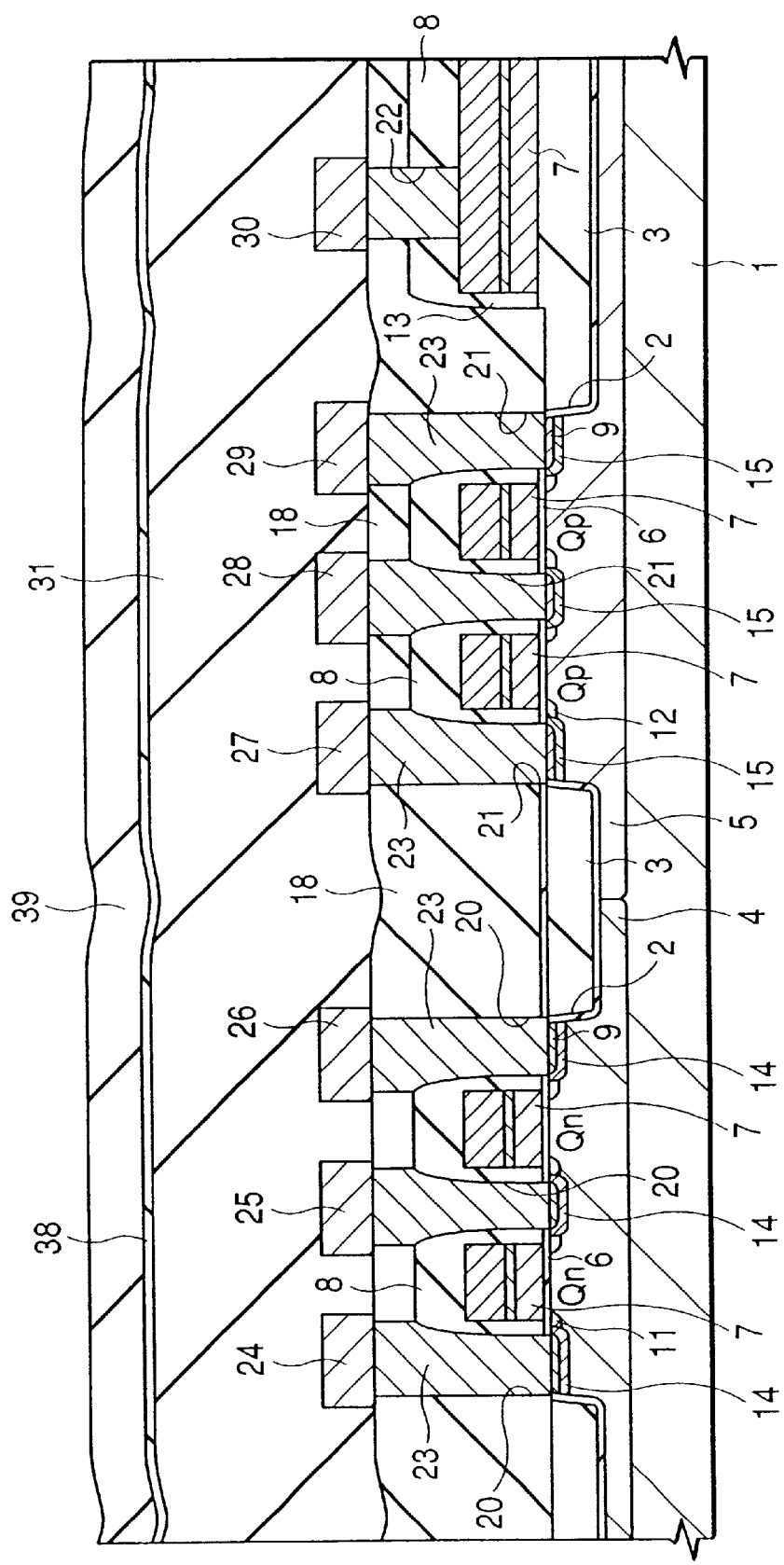
FIG. 21 is a sectional view of an essential part of a semiconductor substrate showing a fabrication process for a semiconductor integrated circuit device that is an embodiment of the present invention.

The formation process of the Cu interconnects 46a to 46e can also be applied to formation of embedded Cu interconnection using the dual Damascene process. In this case, after W interconnects 24 to 30 of the first layer are formed by the process shown in FIGS. 1 to 5, a silicon oxide film 31 of a thickness of the order of 1200 mm, a silicon nitride film 38 as thin as of the order of 50 nm in thickness and a silicon oxide film 39 of a thickness of the order of 350 nm are sequentially formed above the W interconnects 24 to 30 of the first layer by a plasma CVD method as shown in FIG. 21.

Figure 22:
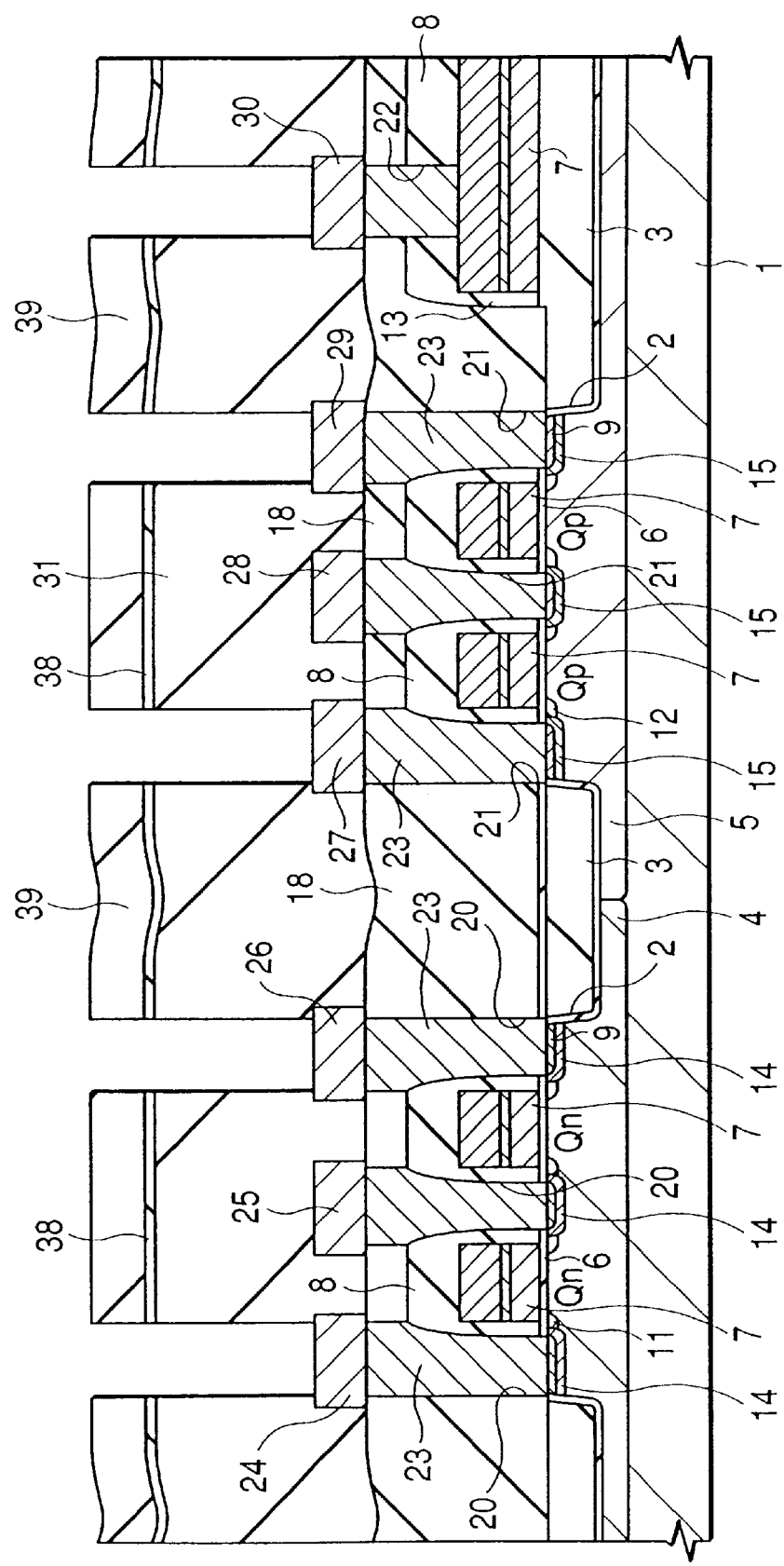
FIG. 22 is a sectional view of an essential part of a semiconductor substrate showing a fabrication process for a semiconductor integrated circuit device that is an embodiment of the present invention.
Figure 23A:
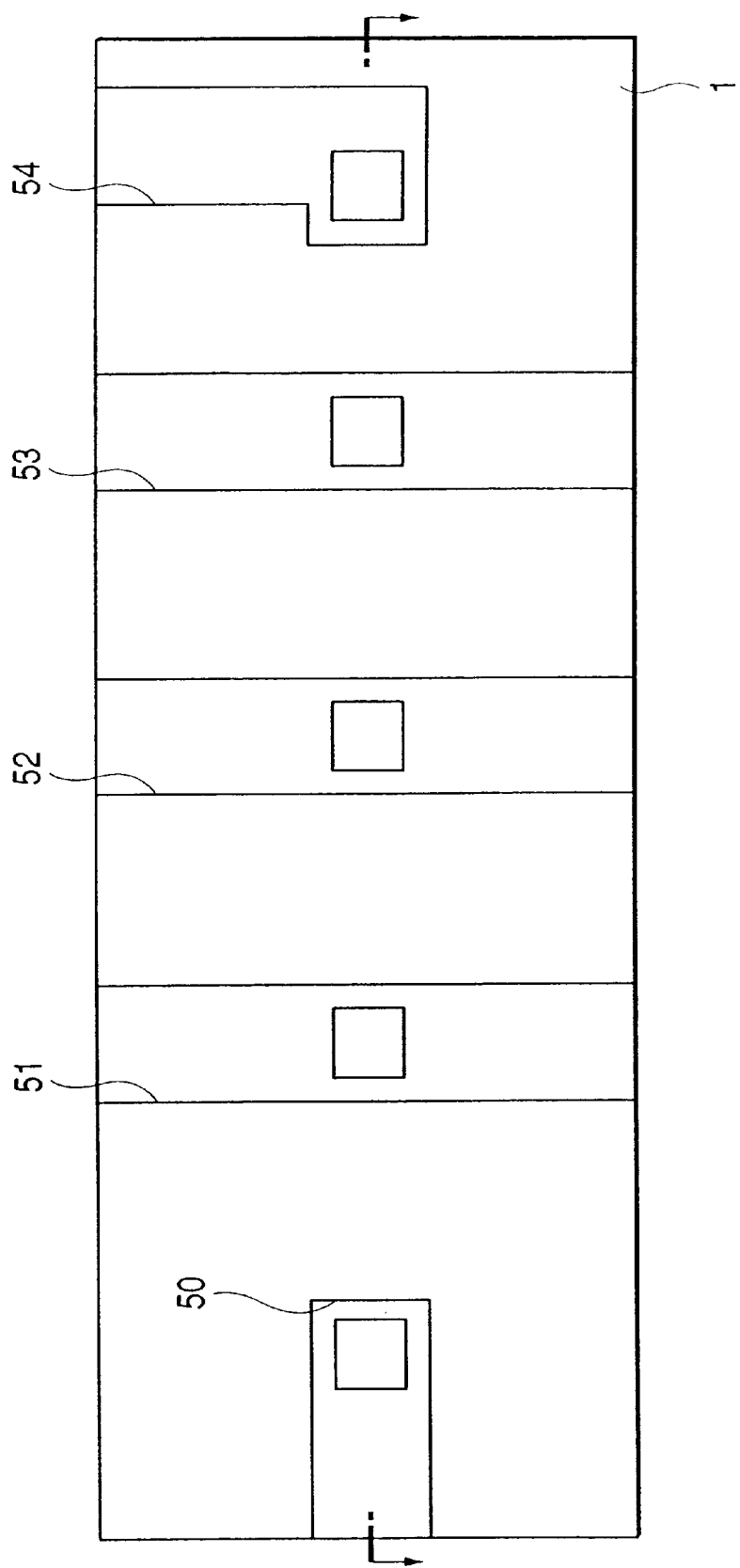
FIG. 23(A) is a plan view of an essential part of a semiconductor substrate showing a fabrication process for a semiconductor integrated circuit device that is an embodiment of the present invention and FIG. 23(B) is a sectional view of the essential part of a semiconductor substrate showing the fabrication process.
Figure 23B:
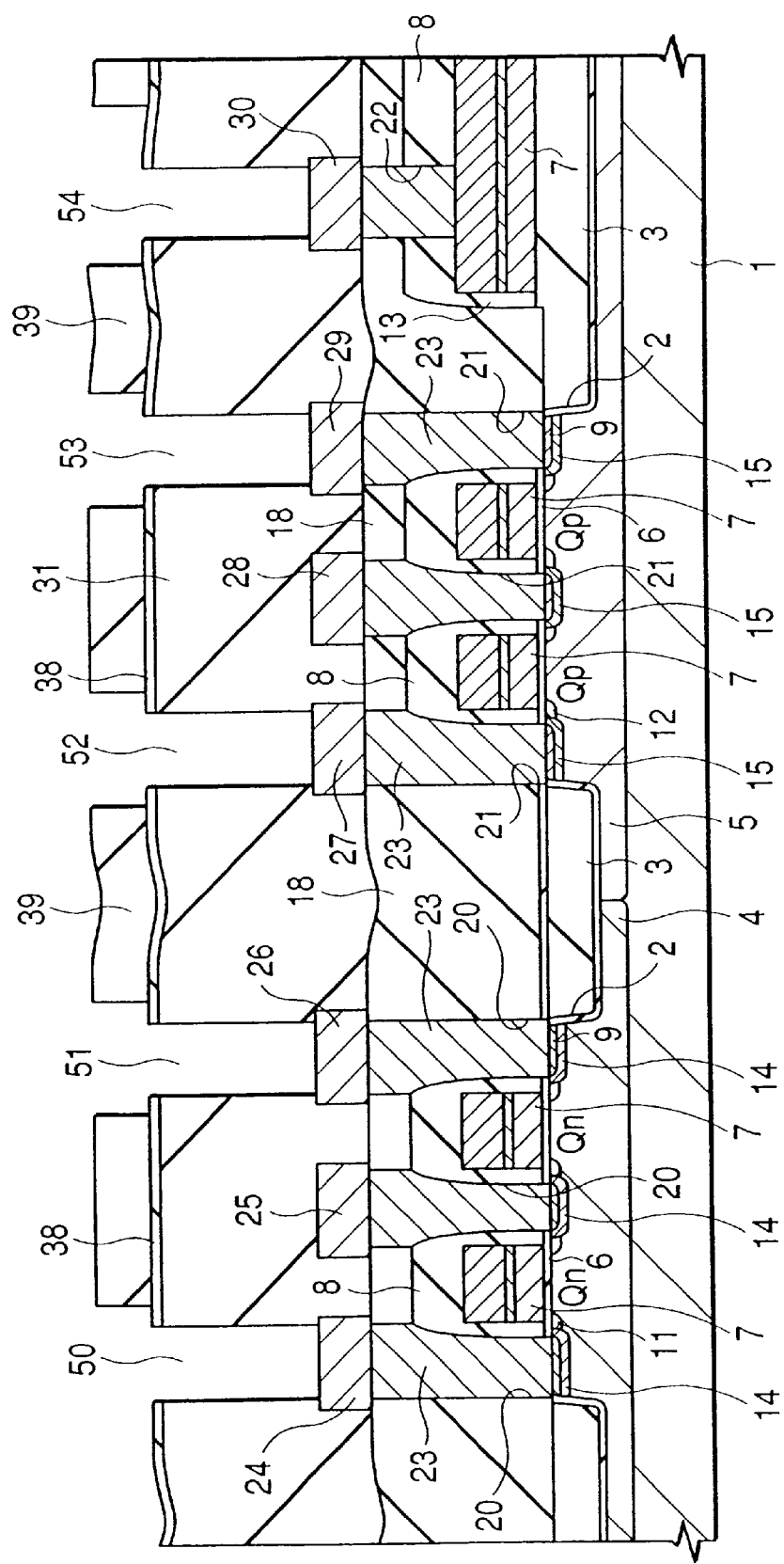

Then, as shown in FIG. 22, the silicon oxide film 39, the silicon nitride film 38 and the silicon oxide film 31 above the W interconnects 24, 26, 27, 29 and 30 of the first layer are sequentially removed by dry etching with a photoresist film as a mask and thereafter, as shown in FIGS. 23(A) and 23(B), the silicon oxide film 39 is further removed using another photoresist film as a mask while the silicon nitride film 38 is used as a stopper of etching and thereby, forming interconnect trenches 50 to 54 which also serve as through holes.

Figure 24:
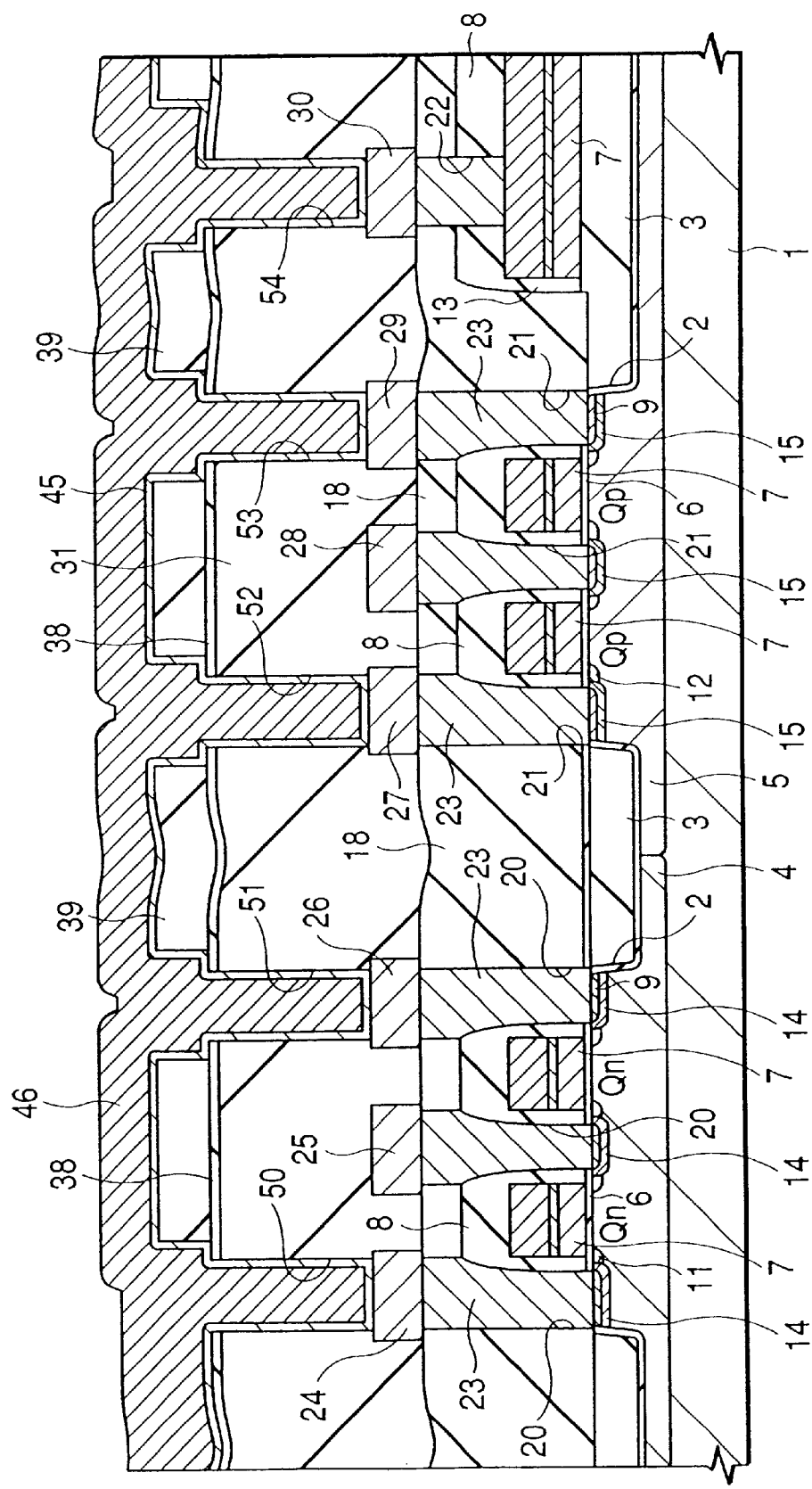
FIG. 24 is a sectional view of an essential part of a semiconductor substrate showing a fabrication process for a semiconductor integrated circuit device that is an embodiment of the present invention.

Then, as shown in FIG. 24, a TiN film 45 as thin as of the order of 50nm is formed on the silicon oxide film 39 and in the interiors of the interconnect trenches 50 to 54 is deposited and thereafter, a Cu film 46 having a thickness sufficiently larger than depths of the interconnect trenches 50 to 54 is deposited on the TiN FILM 45. The interconnect trenches 50 to 54 which also serve as through holes each have a large aspect ratio compared with the interconnect trenches 40 to 44 and therefore, the TiN film 45 is deposited by a CVD method. The Cu film 46 is deposited by repeating sputtering two or more times. The Cu film 45 may be formed by a CVD method, an electroplating or an electroless plating. When the Cu film 46 is formed by the plating method, there is a need for a step of forming a Cu seed layer as a underlying layer for the interconnect trenches 50 to 54 by a sputtering method or the like.

Figure 25:
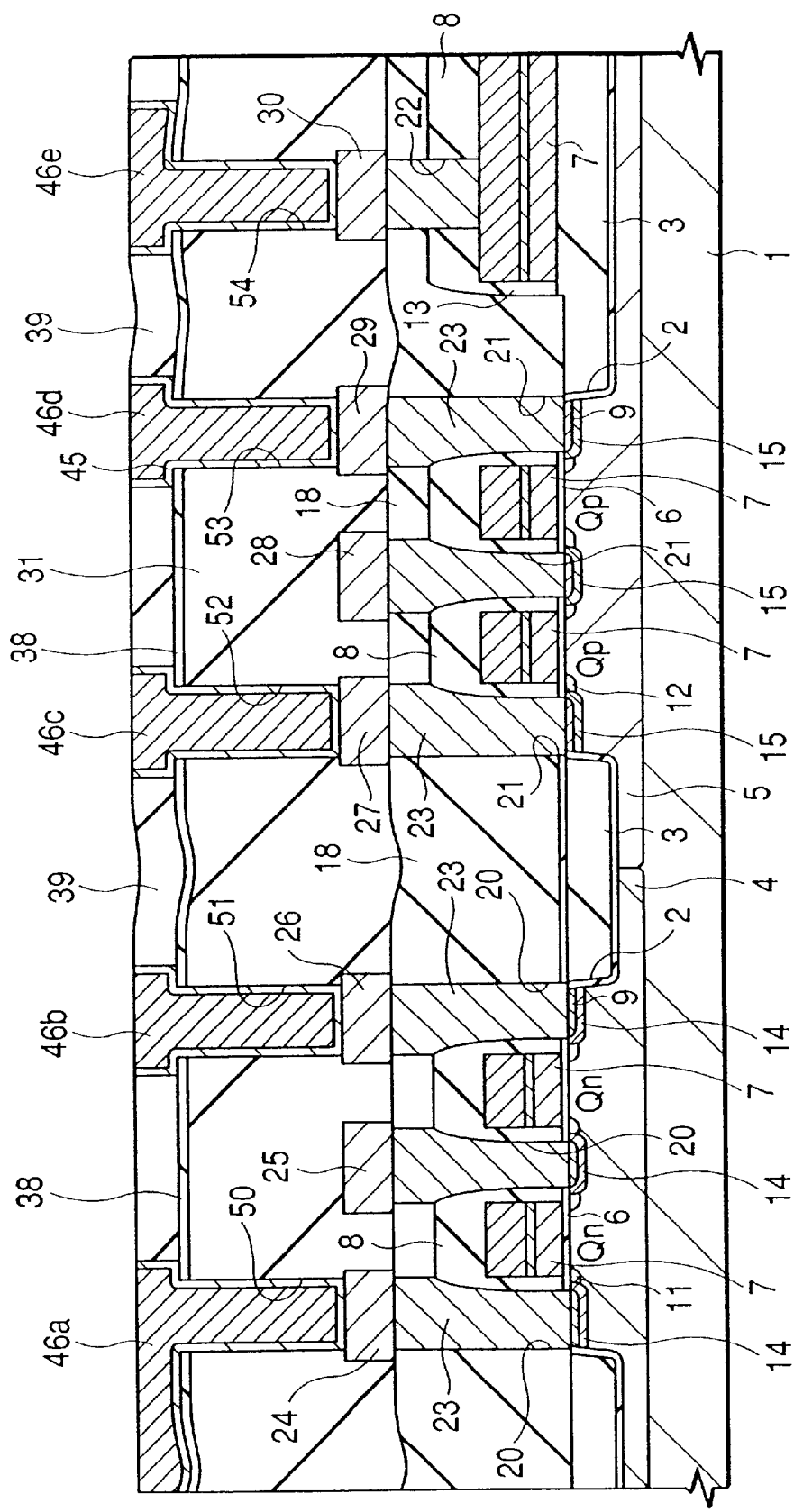
FIG. 25 is a sectional view of an essential part of a semiconductor substrate showing a fabrication process for a semiconductor integrated circuit device that is an embodiment of the present invention.

Then, as shown in FIG. 25, the Cu film 46 and the TiN film 45 outside the interconnect trenches 50 to 54 are removed by the abrasive-grain-free chemical mechanical polishing, the with-abrasive-grain chemical mechanical polishing and the selective chemical mechanical polishing to form embedded Cu interconnects 46a to 46e in the interiors of the interconnect trenches 50 to 54. Steps thereafter is the same as those in the formation process for the Cu interconnects 46a to 46e using the single Damascene process.

To sum up, while the present invention achieved by the present inventors have been described on the basis of the embodiments, the present invention is not limited to the above described embodiments, but, needless to say, various modification and alterations thereof can be made without departing from the scope of the present invention.

In the above described embodiments, while a barrier layer (a TiN film) remaining outside interconnect trenches has been removed by the selective chemical mechanical polishing, the barrier layer may be selectively removed by a dry etching method.

In the above described embodiments, while the chemical mechanical polishing of the first step has been performed by the abrasive-grain-free chemical mechanical polishing which uses a slurry with no abrasive grains, the with-abrasive-grain chemical mechanical polishing which uses a hard polishing pad can substitute for the abrasive-grain-free chemical mechanical polishing. In this case, the chemical mechanical polishing of the second step (the with-abrasive-grain chemical mechanical polishing) uses a polishing pad that is softer than the polishing pad used in the first step. A hard polishing pad means the hardness of the pad is harder than a polyurethane pad, or not less than 90 in ASKER-C hardness.

In the above described embodiments, while the cases where embedded interconnects are formed using Cu or Cu alloy have been described, the process of the embodiments can be applied to the cases where embedded interconnects and plugs are formed using a metal exclusive of Cu (for example, W, Al and others) and the process is especially effective in application for formation of embedded interconnects and plugs in which a metal that requires provision of a conductive barrier layer between the insulating layer and the metal is used.

Of the aspects of the present invention which are disclosed in the present application, typical aspects exert the following effects, which will simply be described:

According to the present invention, since dishing and erosion can be suppressed in formation of embedded metal interconnects by a chemical mechanical polishing (CMP) process, the embedded metal interconnects can be formed in a stable manner and thereby, reliability and fabrication yield of a semiconductor integrated circuit device using embedded interconnects are improved.

What is claimed is:

1. A method for fabricating a semiconductor integrated circuit device, comprising the steps of:
    (a) forming an insulating film on a body, the insulating film having an opening;
    (b) forming a conductive barrier layer in the opening and overlying the insulating film;
    (c) forming a metal film on the conductive barrier layer inside the opening and overlying the insulating film, to fill the opening;
    (d) removing the metal film outside the opening by means of abrasive-grain-free chemical mechanical polishing;
    (e) after the step (d), removing any metal film locally remaining on the conductive barrier layer, and a part of the conductive barrier layer on the insulating film, by means of with-abrasive-grain chemical mechanical polishing; and
    (f) after the step (e), removing the conductive barrier layer remaining on the insulating film by means of selective chemical mechanical polishing that selectively polishes the conductive barrier layer relatively to the metal film in the opening.

2. A method for fabricating a semiconductor integrated circuit device according to claim 1, wherein the insulating film has a plurality of layers.

3. A method for fabricating a semiconductor integrated circuit device according to claim 1, wherein the metal film is made of Cu or alloy containing Cu as a main component.

4. A method for fabricating a semiconductor integrated circuit device according to claim 1, wherein the abrasive-grain-free chemical mechanical polishing is conducted using a polishing liquid having an abrasive grain concentration less than 0.1 wt % of the combined weight of liquid and the abrasive grains.

5. A method for fabricating a semiconductor integrated circuit device according to claim 1, wherein the opening is a hole.

6. A method for fabricating a semiconductor integrated circuit device according to claim 1, wherein the opening is a trench.

7. A method for fabricating a semiconductor integrated circuit device according to claim 1, wherein in the selective chemical mechanical polishing, a polishing selectivity ratio of the conductive barrier layer to the metal film is at least 10:1.

8. A method for fabricating a semiconductor integrated circuit device according to claim 1, wherein the abrasive-grain-free chemical mechanical polishing uses a slurry substantially free of abrasive grains as polishing liquid.

9. A method for fabricating a semiconductor integrated circuit device according to claim 8, wherein the slurry substantially free of abrasive grains includes less than 0.5 wt % abrasive grains of the combined weight of the liquid and abrasive grains.

10. A method for fabricating a semiconductor integrated circuit device according to claim 9, wherein the with-abrasive-grain chemical mechanical polishing uses a slurry containing abrasive grains.

11. A method for fabricating a semiconductor integrated circuit device according to claim 10, wherein the slurry containing abrasive grains contains at least 0.5 wt % abrasive grains of the combined weight of liquid and the abrasive grains.

12. A method for fabricating a semiconductor integrated circuit device according to claim 8, wherein the with-abrasive-grain chemical mechanical processing uses a slurry containing abrasive grains.

13. A method for fabricating a semiconductor integrated circuit device, comprising the steps of:
    (a) forming an insulating film on a body, the insulating film having an opening;
    (b) forming a conductive barrier layer in the opening and overlying the insulating film;
    (c) forming a metal film on the conductive barrier layer inside the opening and overlying the insulating film, to fill the opening;
    (d) removing the metal film outside the opening by means of abrasive-grain-free chemical mechanical polishing using a hard polishing pad;
    (e) after the step (d), removing any metal film locally remaining on the conductive barrier layer, and a part of the conductive barrier layer on the insulating film, by means of chemical mechanical polishing;

(f) after the step (e), removing the conductive barrier layer remaining on the insulating film by means of selective chemical mechanical polishing that selectively polishes the conductive barrier layer relatively to the metal film in the opening.

14. A method for fabricating a semiconductor integrated circuit device according to claim 13, wherein the metal film is made of Cu or alloy containing Cu as a main component.

15. A method for fabricating a semiconductor integrated circuit device according to claim 13, wherein the conductive barrier layer is made of a material harder than the metal film.

16. A method for fabricating a semiconductor integrated circuit device according to claim 13, wherein polishing in the step (e) is conducted using a polishing pad softer than that used in polishing in the step (d).

17. A method for fabricating a semiconductor integrated circuit device according to claim 13,
wherein polishing in the step (d) is conducted using a polishing liquid that has a polishing selectivity ratio of the metal film to the conductive barrier layer of at least 5:1; and
polishing in the step (e) is conducted using a polishing liquid that has a polishing selectivity ratio of the conductive barrier layer to the metal film is at least 5:1.

18. A method for fabricating a semiconductor integrated circuit device according to claim 13, wherein the abrasive-grain-free chemical mechanical polishing uses a slurry substantially free of abrasive grains as polishing liquid.

19. A method for fabricating a semiconductor integrated circuit device, comprising the steps of:
(a) forming an insulating film on a body, the insulating film having an opening;
(b) forming a conductive barrier layer in the opening and overlying the insulating film;
(c) forming a metal film on the conductive barrier layer inside the opening and overlying the insulating film, to fill the opening;
(d) removing the metal film outside the opening by means of first chemical mechanical polishing using a first polishing liquid in a state belonging to a corrosive region of the metal film;
(e) after the step (d), removing any metal film locally remaining on the conductive barrier layer, and a part of the conductive barrier layer on the insulating film, by means of second chemical mechanical polishing in which a selectivity of the metal film to the conductive barrier layer is lower than that in the first chemical mechanical polishing; and
(f) after the step (e), removing the conductive barrier layer remaining on the insulating film by means of third chemical mechanical polishing in which a selectivity of the conductive barrier layer to the metal film in the opening is at least 5:1.

20. A method for fabricating a semiconductor integrated circuit device, comprising the steps of:
(a) forming an insulating film on a body, the insulating film having an opening;
(b) forming a conductive barrier layer in the opening and overlying the insulating film;
(c) forming a metal film on the conductive barrier layer inside the opening and overlying the insulating film, to fill the opening;
(d) removing the metal film outside the opening by means of first chemical mechanical polishing in which a selectivity of the metal film to the conductive barrier layer is at least 5:1;
(e) after the step (d), removing any metal film locally remaining on the conductive barrier layer, and a part of the conductive barrier layer on the insulating film, by means of second chemical mechanical polishing in which a selectivity of the metal film to the conductive barrier layer is lower than that in the first chemical mechanical polishing; and
(f) after the step (e), removing the conductive barrier layer remaining on the insulating film by means of third chemical mechanical polishing in which a selectivity of the conductive barrier layer to the metal film in the opening is higher than that in the second chemical mechanical polishing.

21. A method for fabricating a semiconductor integrated circuit device according claim 20, wherein the third chemical mechanical polishing is conducted using a third polishing liquid containing an anticorrosive.

22. A method for fabricating a semiconductor integrated circuit device according to claim 21, wherein the anticorrosive includes benzotriazole.

23. A method for fabricating a semiconductor integrated circuit device according to claim 22, wherein a concentration of benzotriazole included in the third polishing liquid is in the range of 0.001 to 1 wt %.

24. A method for fabricating a semiconductor integrated circuit device according to claim 22, wherein a concentration of benzotriazole included in the third polishing liquid is in the range of 0.01 to 1 wt %.

25. A method for fabricating a semiconductor integrated circuit device according to claim 20, wherein the insulating film has a plurality of layers.

26. A method for fabricating a semiconductor integrated circuit device according to claim 20, wherein the first chemical mechanical polishing and the second chemical mechanical polishing are respectively conducted using different polishing pads.

27. A method for fabricating a semiconductor integrated circuit device according to claim 20, wherein the second chemical mechanical polishing and the third chemical mechanical polishing are respectively conducted using the same polishing pads.

28. A method for fabricating a semiconductor integrated circuit device, comprising the steps of:
(a) forming an insulating film on a body, the insulating film having an opening;
(b) forming a conductive barrier layer in the opening and overlying the insulating film;
(c) forming a metal film on the conductive barrier layer inside the opening and overlying the insulating film, to fill the opening;
(d) removing the metal film outside the opening by means of first chemical mechanical polishing in which a selectivity of the metal film to the conductive barrier layer is at least 5:1;
(e) after the step (d), removing any metal film locally remaining on the conductive barrier layer, and a part of the conductive barrier layer on the insulating film, by means of second chemical mechanical polishing in which a selectivity of the metal film to the conductive barrier layer is lower than that in the first chemical mechanical polishing; and
(f) after the step (e), removing the conductive barrier layer remaining on the insulating film by means of third chemical mechanical polishing in which a selectivity of the conductive barrier layer to the metal film in the opening is at least 5:1.

29. A method for fabricating a semiconductor integrated circuit device according to claim 28, wherein the insulating film has a plurality of layers.

30. A method for fabricating a semiconductor integrated circuit device according to claim 28, wherein the metal film is made of Cu or alloy containing Cu as a main component.

31. A method for fabricating a semiconductor integrated circuit device according to claim 28, wherein a polishing selectivity ratio of the metal film to the conductive barrier layer in the first chemical mechanical polishing is at least 8:1.

32. A method for fabricating a semiconductor integrated circuit device according to claim 28, wherein a polishing selectivity ratio of the metal film to the conductive barrier layer in the second chemical mechanical polishing is at most 3:1.

33. A method for fabricating a semiconductor integrated circuit device according to claim 28, wherein a polishing selectivity ratio of the conductive barrier layer to the metal film in the third chemical mechanical polishing is at least 10:1.

34. A method for fabricating a semiconductor integrated circuit device according to claim 28, wherein a polishing selectivity ratio of the conductive barrier layer to the metal film in the third chemical mechanical polishing is at least 20:1.

35. A method for fabricating a semiconductor integrated circuit device according to claim 28, wherein the conductive barrier layer is made of TiN.

36. A method for fabricating a semiconductor integrated circuit device according to claim 28, wherein the first chemical mechanical polishing and the second chemical mechanical polishing are respectively conducted using different polishing pads.

37. A method for fabricating a semiconductor integrated circuit device, comprising the steps of:
  (a) forming an insulating film on a body, the insulating film having an opening;
  (b) forming a conductive barrier layer in the opening and overlying the insulating film;
  (c) forming a metal film on the conductive barrier layer inside the opening and overlying the insulating film, to fill the opening;
  (d) removing the metal film outside the opening by means of abrasive-grain-free chemical mechanical polishing;
  (e) after the step (d), removing any metal film locally remaining on the conductive barrier layer, and a part of the conductive barrier layer on the insulating film, by means of with-abrasive-grain chemical mechanical polishing; and
  (f) after the step (e), removing the conductive barrier layer remaining on the insulating film by means of a selective removal process that selectively removes the conductive barrier layer relatively to the metal film in the opening.

38. A method for fabricating a semiconductor integrated circuit device according to claim 17, wherein the selective removal process of the step (f) is dry etching.

39. A method for fabricating a semiconductor integrated circuit device according to claim 37, wherein the abrasive-grain-free chemical mechanical polishing uses a slurry substantially free of abrasive grains as polishing liquid.

40. A method for fabricating a semiconductor integrated circuit device according to claim 39, wherein the with-abrasive-grain chemical mechanical polishing uses a slurry containing abrasive grains.

41. A method for fabricating a semiconductor integrated circuit device, comprising the steps of:
  (a) forming an insulating film on a body, the insulating film having an opening;
  (b) forming a conductive barrier layer in the opening and overlying the insulating film;
  (c) forming a metal film on the conductive barrier layer inside the opening and overlying the insulating film, to fill the opening;
  (d) removing the metal film outside the opening by means of abrasive-grain-free chemical mechanical polishing;
  (e) after the step (d), removing any metal film locally remaining on the conductive barrier layer, and a part of the conductive barrier layer on the insulating film, by means of with-abrasive-grain chemical mechanical polishing;
  (f) after the step (e), removing the conductive barrier layer remaining on the insulating film by means of selective chemical mechanical polishing that selectively polishes the conductive barrier layer relatively to the metal film in the opening; and
  (g) after the step (f), cleaning the body in a state of light shielding.

42. A method for fabricating a semiconductor integrated circuit device according to claim 41, wherein the abrasive-grain-free chemical mechanical polishing uses a slurry substantially free of abrasive grains as polishing liquid.

43. A method for fabricating a semiconductor integrated circuit device according to claim 42, wherein the with-abrasive-grain chemical mechanical polishing uses a slurry containing abrasive grains.

44. A method for fabricating a semiconductor integrated circuit device according to claim 41, wherein the metal film is made of Cu or alloy containing Cu as a main component.

45. A method for fabricating a semiconductor integrated circuit device according to claim 41, wherein cleaning in the step (g) is conducted in a state of light shielding with an illumination of at most 180 lux.

* * * * *